United States Patent [19]
Myers

[11] Patent Number: 5,329,242
[45] Date of Patent: Jul. 12, 1994

[54] METHOD AND APPARATUS FOR SIGNAL DEMODULATION USING TIME-INTERVALS

[76] Inventor: Glen A. Myers, 279 Laureles Grade Rd., Salinas, Calif. 93908

[21] Appl. No.: 965,588

[22] Filed: Oct. 22, 1992

[51] Int. Cl.⁵ ............... H03D 3/00; H04L 27/14
[52] U.S. Cl. ............... 329/300; 329/321; 329/341; 375/80; 375/88; 455/214; 455/337
[58] Field of Search ........... 329/300, 301, 303, 321, 329/341, 342, 343; 455/214, 337; 375/80, 82, 88

[56] References Cited

U.S. PATENT DOCUMENTS

| | | | |
|---|---|---|---|
| 3,873,931 | 3/1975 | Basse et al. | 329/122 |
| 4,027,264 | 5/1977 | Gutleber | 328/167 |
| 4,412,339 | 10/1983 | Alfke et al. | 375/95 |
| 4,859,958 | 8/1989 | Myers | 329/112 |
| 4,992,747 | 2/1991 | Myers | 329/316 |
| 4,992,748 | 2/1991 | Gard | 329/321 |
| 5,038,115 | 8/1991 | Myers et al. | 331/2 |
| 5,159,281 | 10/1992 | Hedstrom et al. | 329/312 |

OTHER PUBLICATIONS

Park, Soon Sang, Thesis "On Capture Effect of FM Demodulators," Mar. 1989, published by Naval Postgraduate School, Monterey, Ca.

Lathi, B. P., "Modern Digital and Analog Communication Systems," pp. 490, 491 and 492, published by The Dryden Press, copyright 1989.

Sundresh et al., "Maximum A. Posteriori Estimator for Suppression of Interchannel Interference in FM Receivers", IEEE Transactions on Communications, vol. COM-25, No. 12, Dec. 1977, pp. 1480–1485.

"Video Tape Recorders" by Harry Kybett, copyright 1975 by Howard W. Sams & Co., Inc., pp. 148–149.

Primary Examiner—Siegfried H. Grimm
Attorney, Agent, or Firm—LaRiviere & Grubman

[57] ABSTRACT

Method and apparatus for recovering a message signal from a carrier signal. More specifically, method and apparatus for demodulating a frequency modulated signal using measured time intervals between zero-crossings of a received carrier signal. The method and apparatus employing averaging techniques to provide a more accurate signal representing the message signal. The method and apparatus employing mapping techniques to provide a more accurate signal representing the message signal.

33 Claims, 15 Drawing Sheets

METHOD AND APPARATUS FOR SIGNAL DEMODULATION USING TIME-INTERVALS

TECHNICAL FIELD

The present invention generally relates to demodulation of signals. More specifically, the present invention relates to demodulation of frequency-modulated signals broadcast for reception.

BACKGROUND ART

Today, signals are broadcast in many ways. Signals can be broadcast over cables, by laser, in the atmosphere, in space, under water and through other media. These signals contain information which is transmitted in varying forms. One common form of signal transmission is frequency modulation (FM).

Both amplitude and frequency modulation are methods of superimposing information onto a carrier signal. Specifically, in FM broadcast, a carrier wave is used to transmit information to a receiving audience. This is most commonly known as FM radio. Consequently, the frequency of the carrier signal is caused to vary in accordance with a voltage variation (message) to be carried.

In an FM transmission, a sinusoidal carrier signal having variations of instantaneous frequency is received. These variations can be either above or below the center frequency of the carrier signal. Thus, a detecting device (demodulator) for detecting these variations is typically constructed such that its output will vary according to the instantaneous frequency of an incoming signal. Such detecting devices are sensitive to variations produced by interfering signals (interference) or by non-linearities in components of the receiver. As these detecting devices have frequency dependent components, the above-mentioned non-linearities and interference affect signal demodulation. Practical FM detectors known in the prior art include slope detectors (balanced discriminators, ratio detectors and quadrature demodulators), differentiators, pulse-counting discriminators and phase-locked loops.

In U.S. Pat. No. 4,859,958, by the inventor of the present invention, a demodulator which provides improved demodulation of all of several FM carriers, including weaker signals in the presence of dominant carriers, is disclosed. In that patent, a frequency demodulator converts the instantaneous frequency of the applied signal to a voltage. When the sum of two or more signals is present at the input to the demodulator, the output voltage is proportional to the instantaneous frequency of the dominant portion of the input signal due to the capture associated with FM demodulations.

Prior art FM detectors are often characterized as exhibiting "threshold effect." The quality of the recovered message is commonly indicated by the value of its signal-to-noise ratio (SNR). The value of the SNR of the recovered message is related to the value of the SNR of the input (radio-frequency voltage) to the receiver. For good quality reception (large values of SNR of the receiver input), the message quality is linearly related to the quality of the receiver input. Threshold of the receiver is defined as that value of receiver input SNR (signal quality) where the aforementioned relation ceases to be linear. For prior art FM detectors, there is a marked departure from linearity for values of receiver input SNR less than the threshold value. Therefore, the onset of "threshold effect" is a sudden loss of quality of the recovered message. When the quality (SNR) of the received signal is "below threshold," the quality of the recovered message deteriorates rapidly with decreasing values of input SNR.

The phenomenon of threshold effect typically causes a loss of message quality when the quality of the received carrier is in the range from 8 to 13 decibels for prior art FM detectors. Anyone who has ever been driving and listening to music on their FM radio when suddenly the music intermittently cuts out and is replaced with static-like noise, has experienced threshold effect. Thus, there is no 'graceful degradation' of FM receivers operating "below threshold."

Prior to the present invention, threshold effect was generally believed to be caused by the nature of FM signal transmission. A common perception is that 'strong' interference creates "spikes" or "impulses" of noise at the receiver output which result in a crackling sound. Lathi, B. P., *Modern Digital and Analog Communications Systems*, Holt, Rinehart and Winston, Inc. (Florida, 2nd ed. 1989), pp. 490-492. The perception is caused by analysis based on the concept of instantaneous frequency of the carrier. The present invention recognizes that frequency is a defined quantity and not a physical or natural property of the FM carrier (receiver input).

The perception that "threshold effect" is an inherent part of FM is not supported in practice because different demodulator circuits have different values of threshold. It is well known that phase-locked loop demodulators have superior noise performance (smallest values of threshold) and pulse-counting discriminators have inferior noise performance (largest value of threshold) in the family of prior art FM detectors. These differences in values of threshold support a conclusion that "threshold" is caused by the detector circuitry and not by the nature of the carrier modulation.

According to the teachings and disclosures of the present invention, FM threshold effect is not due to the nature of FM transmission, but rather due to the inability of prior art demodulators to resolve or demodulate source signals (hereinafter source, message, modulating and applied signal(s) are used interchangeably) from carrier signals in the presence of strong interference.

Therefore, a demodulator which can resolve source signals from a carrier wave even in the presence of large amounts of noise is desirable. Additionally, an FM demodulator which can resolve signals such that any degradation therein remains substantially linear for smaller values of input signal-to-noise ratio, i.e., reduction of the value of threshold associated with prior art demodulators, is desirable.

Heretofore, no prior art demodulator uses the measured time intervals between zero values of an FM carrier to detect the source signal and to mitigate the effects of interference.

DISCLOSURE OF INVENTION

The present invention uses time intervals between zero values of a carrier signal to demodulate and therein recover the message signal. The new FM demodulator of the present invention has no frequency-dependent circuits for converting frequency to voltage. Rather, the zero values or zero-crossings of the received carrier wave are measured, sampled or otherwise determined. From these zero values or zero-crossings, the time interval between successive zero values can be determined and converted to a voltage which represents a sample value of the recovered message. This time interval is a measure of the instantaneous frequency of the carrier wave. The number of zeros per second is also related to the modulating signal of the carrier signal. Thus, the present invention uses time intervals between zero-crossings of the carrier for demodulating the carrier signal to resolve the source signal or message, allowing for a substantially linear or gradual degradation at small values of input SNR, as compared to prior art demodulators.

Moreover, because the time-interval demodulator of the present invention utilizes intervals between zero-crossings, considerable diversity in the manner or method of recovering a message is provided. This diversity can be used for signals of varying strength, i.e., tailored to reduce the effects of weak or strong interference. In the case of strong interference, the threshold effect associated with FM can be moved to lower values of input SNR of the received signal, as compared to prior art demodulators. This ultimately improves the overall sensitivity of the receiver.

The present invention defines the interval between successive zero values or zeros as $n_i$. The extreme values of $n_i$ correspond to the peak-to-peak variation of the carrier frequency.

To reinforce the principle of the demodulation method of the present invention, the modulation of interest is called time-interval modulation (TIM) when the message carried is analog; and when the message carried is digital (bit stream), then frequency-shift keying (FSK) is called time-interval-shift-keying (TISK).

For analog messages, a TIM demodulator can be designed according to the present invention such that the message or source signal can be recovered by demodulation.

For digital messages, a TISK demodulator can be designed according to the present invention for digital data, i.e., bit streams. In a TISK demodulator according to the present invention, the extreme values of $n_i$ can be determined such that the message or source signal (bit stream) can be recovered by demodulation.

The present invention uses averaging of samples of $n_i$ to reduce effects of interference. Because $n_i$ may vary in time due to the effects of interference, it follows that $n_i$ may not be an accurate value for demodulation purposes. However, as interference tends to be random, $n_i$ will vary randomly. Averaging over several consecutive values of $n_i$ will preserve the message carried on the carrier wave and reduce the effects of interference.

A limited number of samples of values of $n_i$ can be averaged for each cycle of modulation. Thus, sufficient cycles of carrier frequency must occur within each cycle of modulation. The number of cycles of carrier for each cycle of modulation sets the limit on the number of values of $n_i$ which can be averaged. For example, a carrier frequency of 100 MHz modulated by a source signal of 20 kHz will have 5,000 cycles of carrier for each cycle of modulation. To preserve the message, averaging will involve much less than 5,000 values of $n_i$, e.g., in this example, perhaps 500 values. The ultimate effect is to smooth $n_i$ such that the waveform is accurately demodulated.

Strong interference can create large deviations from desired values of $n_i$. Due to the degree of interference, effects will remain after averaging values of $n_i$. Thus, mapping rules, according to the present invention, are used for reducing the effects of strong interference.

Many mapping rules are possible according to the principles of the present invention. An optimum mapping rule depends on knowledge of the carrier and of the interference. Thus, it is impossible to seek or identify a best rule or to list all good rules. Rather, only a variety of rules and their effects can be shown for particular signals. According to the present invention, the choice of mapping rule may depend on the application of use.

Employing the present invention, several mapping rules and combinations thereof are described. The objective in all mapping rules is to make the value of $n_i$ with interference converge to the value of $n_i$ without interference.

Some of the mapping rules of the present invention are: determining a mean value for $n_i$ prior to averaging; clipping $n_i$ prior to averaging; delta mapping of $n_i$ prior to averaging; delta mapping of clipped $n_i$ prior to averaging; and delta mapping after averaging. The above rules can be used on both analog and digital forms of messages. Additionally, a two-value mapping rule for digital messages is taught by the present invention, wherein a threshold value $n_T$ is determined.

A method of demodulating, according to the present invention, comprises: creating a voltage equivalent to $n_i$; implementing a mapping rule; and averaging a predetermined number of values.

TIM and TISK demodulators of the present invention may be implemented in electronic circuitry. As demodulators can be made for specific types of messages, demodulators for both analog messages and digital messages are described herein.

Other features of the present invention are disclosed or apparent by referenced to the Best Mode For Carrying Out The Invention Section of the disclosure herein.

BRIEF DESCRIPTION OF THE DRAWINGS

For a fuller understanding of the present invention, reference is made to the accompanying drawings in the following detailed description of the Best Mode For Carrying Out The Invention.

Reference numbers refer to the same or equivalent parts of the present invention throughout the several figures of the drawings.

BEST MODE FOR CARRYING OUT THE INVENTION

Figure 1:
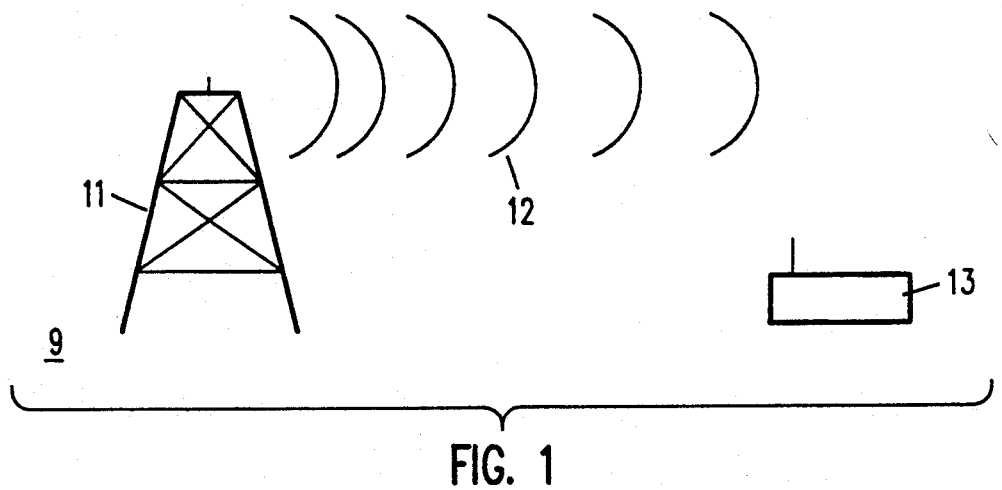
FIG. 1 shows one type of data transmission.

Referring to FIG. 1, one type of data transmission 9 is shown. In data transmission 9, a transmitter 11 transmits electromagnetic (EM) waves 12 to receiver 13. EM waves 12 are modified for message transmission. One form is to modulate the frequency of the wave. Frequency modulation (FM) is one such modification of EM waves 12.

Figure 2:
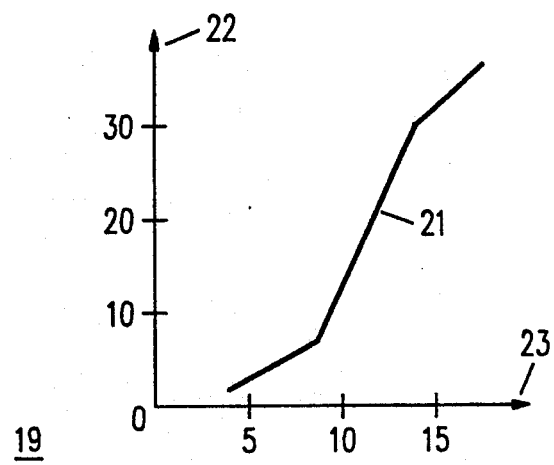
FIG. 2 is a typical plot of FM threshold effect.

As mentioned elsewhere in the specification, the threshold effect for FM limits reception quality. In FIG. 2, a typical plot 19 for the threshold effect of FM for a common demodulator is shown. Output y-axis 22 represents SNR of an output of a demodulator in decibels (db). Input x-axis 23 represents an input SNR of a demodulator in decibels. Thus, characteristic curve 21 is an indication of the quality of a message output by a common demodulator. As mentioned previously and as shown here, the FM threshold effect of a typical demodulator typically lies between 8 db and 13 db as referenced on input x-axis 23. Thus, if the input SNR is within the above-mentioned range, then the data received by a common demodulator will be significantly distorted by noise, to the point of incomprehensibility of the message, e.g., music. In the case of an FM radio broadcast, the music would appear to suddenly be garbled due to noise, as opposed to a slow or linear degradation of sound quality.

Figure 3:
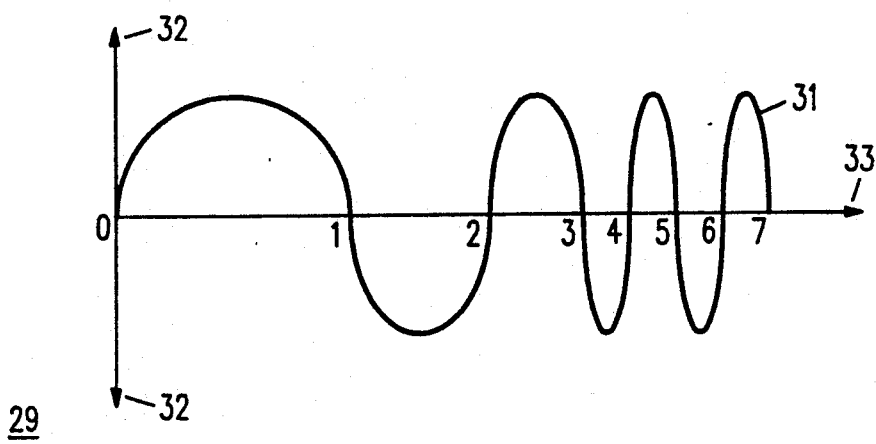
FIG. 3 shows a carrier wave diagram.

FIG. 3 shows a carrier wave diagram 29. In broadcast, a sinusoidal carrier wave is used to transmit messages to a receiving audience. Carrier wave 31 is such an FM EM wave. Voltage axes 32 and time axis 33 are used for defining carrier wave 31. Carrier wave 31 is a function of both voltage and time, and thus, can be mathematically represented as $v_c(t)$. Thus for any time t, the voltage of carrier wave 31 for that instance of time can be determined, assuming the characteristic equation for carrier wave 31 is known.

In FIG. 3, zero-crossings are indicated as 0 through 7. The sine wave characteristic of carrier wave 31 has a modulated frequency which can be determined from zero-crossings. Starting at time t equal to zero, let each occurrence in time for a zero be represented as $t_i$, for i a positive integer. Thus, $t_{10}$ is the time of the tenth zero value of $v_c(t)$. Define: $n_i = t_i - t_{i-1}$. Thus, $n_i$ defines an interval of time between adjacent zero values of $v_c(t)$. Wherein, $n_i$ for each value of i can be measured, and this is the value of time between successive zero values of $v_c(t)$.

In a typical FM transmitter, a message voltage $v_m(t)$ is applied to a voltage-controlled oscillator (VCO), wherein the frequency of a carrier signal is modulated. Typically, the carrier frequency $f_c$ increases with message voltage $v_m(t)$. The peak-to-peak values $2\Delta f$ of the carrier frequency correspond to the peak-to-peak values of the message voltage. In FM, $\Delta f$ is called peak frequency deviation of the carrier. Since frequency is a defined quantity, what physically transpires in FM is a variation of $n_i$ with the message voltage.

Letting $n_i$ be the value in seconds of the interval between adjacent zero values of the modulated carrier, then $n_i$ will vary about some constant value equal to N. That is, $n_i = N + \Delta I$, where N is the value of $n_i$ when the carrier is not modulated (message voltage equals zero) and typically where $\Delta I > 0$ when $v_m(t) < 0$ and $\Delta I < 0$ when $v_m(t) > 0$. This assumes that in a transmitter, $v_m(t) > 0$ creates positive values of a carrier frequency deviation, and $v_m(t) < 0$ creates negative values of a carrier frequency deviation. Notably, the present invention should not be considered to be limited to this convention. For example, $v_m(t) > 0$ could create negative values of carrier frequency deviation. The above convention is used only by way of example and not limitation in order to provide a reference for explanation of the present invention. Because $v_m(t)$ is related to $1/n_i$ in the receiver, it must be shown that variations of $n_i$ are directly a good approximation of the message $v_m(t)$. To proceed by example, if $N = 100$ and $\Delta I$ has extreme values of $+5$ or $-5$, then $n_i$ will have extreme values of 95 and 105. Therefore, $2(f_c + \Delta f) \rightarrow 1/95 = 0.0105$ and $2(f_c - \Delta f) \rightarrow 1/105 = 0.0095$. Observe that $(1/95)(N^2) = 105$, which equals one extreme value of $(N + \Delta I)$ and that $(1/105)(N^2) = 95$, which equals the other extreme value of $(N + \Delta I)$. A conclusion is that the variations of the value of $N + \Delta I$ can typically be used directly in demodulating or recovering $v_m(t)$.

It should be understood with the teachings of the present invention that it is possible to solve generally for the maximum percent error of the recovered voltage $v_m(t)$ which is created by using $n_i$ values directly instead of $1/n_i$ values. The maximum error occurs at peak values of $v_m(t)$. Let the maximum value of $\Delta I$ be kN, where k is much less than 1, i.e., $n_i = N \pm kN$. Scaling by N, i.e., form $n_i/N$, results in maximum values of interest $1/(1-k)$ for frequency demodulation and $1+k$ for interval demodulation. The difference, D, of these maximum values is $k^2/(1-k)$. The maximum percent error occurs for these maximum values and is $(D/[1/(1-k)])100 = 100 \ k^2$. Similarly, the scaled minimum values of interest are $1/(1+k)$ for frequency demodulation and $1-k$ for interval demodulation, which allow the like percent error to be calculated, similarly as shown above. The result is the same percent error for the extremes of $v_m(t)$. For example, an error less than 10% means that $k^2$ equals 0.1. Hence, the maximum and minimum values of $n_i$ are constrained to be between $N(1+k)$ and $N(1-k)$, where k is equal to $\sqrt{0.1} = 0.316$. For an error less than 1%, $k^2$ equals 0.01 or $k = 0.1$, wherein the maximum and minimum values of $n_i$ are constrained between $N(1+0.1)$ and $N(1-0.1)$. This error can be eliminated by using $1/n_i$ as the final output rather than $n_i$. Circuit implementations for converting $n_i$ to $1/n_i$ are well-known in the prior art of the present invention. For example, hand-held calculators and computers use standard circuitry to display $1/n_i$ when $n_i$ is entered.

In FM, the usual descriptive parameters of the modulated carrier are amplitude, message bandwidth, peak frequency deviation ($\Delta f$) and modulation index ($\beta$). The intermediate frequency (IF) of the carrier just prior to demodulation is not used in normal FM analysis. However, in TIM, the important parameters are amplitude, IF and deviation ratio $r_d$, wherein $r_d$ equals $\Delta f/IF$. Furthermore, the bandwidth of a message affects the number of intervals used for averaging as described later in this section. Modulation index, $\beta$, appears in the equation for a tone-modulated carrier, and also appears in the Fourier transform of the same. In amplitude modulation (AM), the modulation index or percent modulation indicates directly the peak-to-peak variation of the carrier amplitude. In FM, a like definition is $r_d$, which indicates directly the peak-to-peak variation of the carrier frequency.

The value of $r_d$ is related to the peak values of $n_i$ as follows. Let U and L represent the maximum (upper) and minimum (lower) values of $n_i$ respectively, then $$U = 1/[2(IF - \Delta f)] = 1/[2(IF(1 - r_d))] \quad (1)$$

$$L = 1/[2(IF + \Delta f)] = 1/[2IF((1 + r_d))] \quad (2)$$

where $1/(2IF)$ is the value of $n_i$ without modulation, i.e., "dead" carrier, or the average value of $n_i$ when the modulation has zero average value.

In TIM, (U−L) is a peak-to-peak variation of a recovered message. It is, of course, desirable that this value be considerably larger than uncertainty caused by the circuits used in measurement. From equations (1) and (2), the magnitude of (U−L) is determined by $\Delta f$ and IF. The value of $\Delta f$ is often a predetermined value set in the transmitter. It can be changed in the receiver by frequency multiplication. (increased) or division (decreased), which does not change $r_d$. A receiver IF can be set to a desired value by heterodyning. Moreover, decreasing the IF will increase (U−L).

For example, in commercial FM, $\Delta f$ equals 75 kHz and IF for a typical receiver equals 10.7 MHz. Therefore, $r_d$ equals 0.007 and (U−L) equals 1.3 nanoseconds (ns). If the IF is changed to 455 kHz, then $r_d$ equals 0.165 and (U−L) equals 376 ns. An IF of 455 kHz still allows several cycles of carrier for each "cycle" of modulation. Typically, at least 10 cycles of carrier are needed for each "cycle" of modulation to accurately resolve a message; however, according to the Nyquist sampling rate, fewer cycles of carrier per cycle of modulation are needed.

In another example, the transmission of digital data (bitstream) can be practiced with the present invention. Assuming that 10 cycles of a carrier per bit at the input of a demodulator are used, let $r_b$ be the bit rate in bits per second (bps). Then IF will equal $10r_b$. In narrowband FM, $\Delta f$ is approximately equal to $r_b$. From equations (1) and (2), we can determine under these conditions that $U = 1/18r_b$ and $L = 1/21r_b$. Wherein, (U−L) is approximately equal to $(8 \times 10^{-3})/r_b$. If $r_b$ equals 9,600 bps, then (U−L) is equal to 0.827 microseconds ($\mu s$), where U equals 5.787 $\mu s$ and L equals 4.960 $\mu s$. Moreover, increasing $\Delta f$ will increase (U−L).

I. Averaging to Reduce the Effects of Interference

The use of averaging in the TIM and/or TISK demodulators is contemplated by the present invention to reduce effects of interference. For example, let the input to a TIM demodulator be $v_r(t)$, where $v_r(t) = v_c(t) + v_I(t)$, and where $v_I(t)$ is voltage due to interference. From which it follows that:

$$n_{ri} = n_{ci} + n_{Ii}, \quad (3)$$

where $n_{ri}$ is the measured value, and $n_{Ii}$ is the departure from (interference in) a desired value $n_{ci}$. If interference is weak then interference power is considerably less than TIM carrier power. A result of which is that $n_{Ii}$ is small compared with $n_{ci}$. Further, as $n_{Ii}$ is a random number, these small random values can be diminished by averaging over several consecutive values. Such a running average preserves the message carried by $n_{ci}$, provided the number of values is limited. For example, if there are 40 intervals of the carrier for each "cycle" of modulation, then averaging about 10 intervals will preserve the message.

Figure 4:
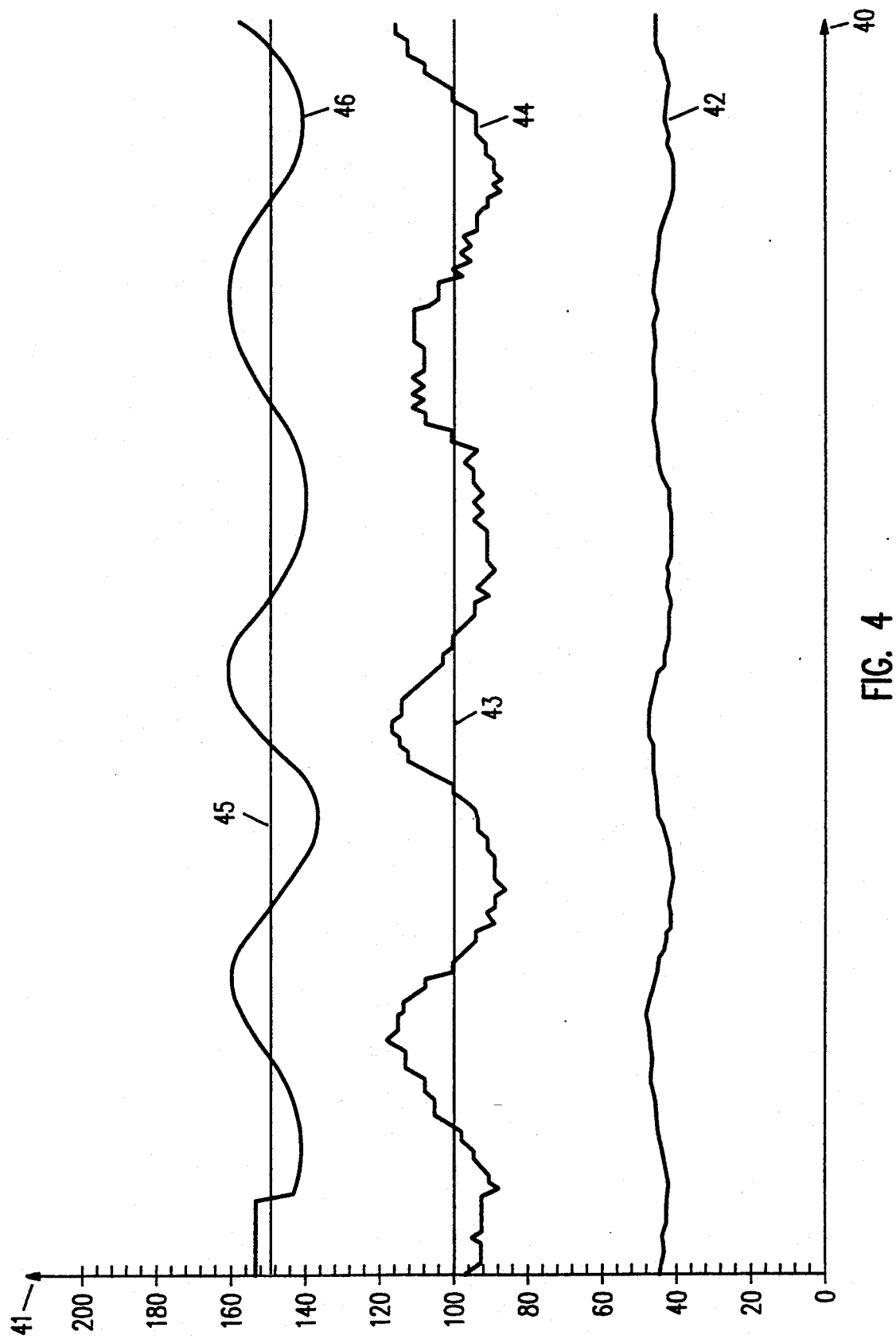
FIG. 4 is a plot of a computerized simulation showing the effect of averaging.
Figure 5:
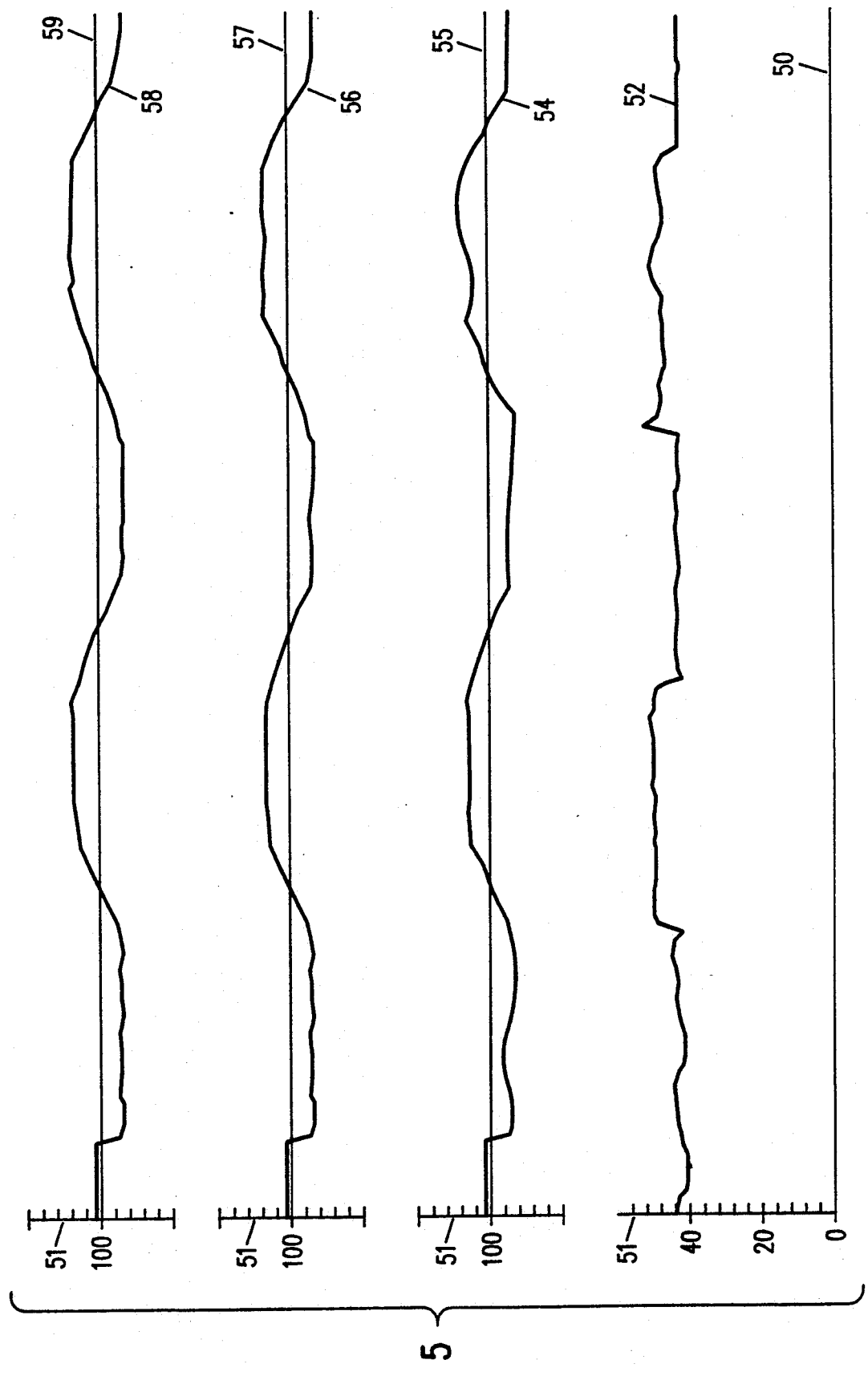
FIG. 5 is a plot of a computerized simulation showing the effect of averaging on a TISK carrier.

FIGS. 4 and 5 show the effect of averaging values of $n_{ri}$. FIG. 4 is a computerized simulation for a sinusoidal message wave form. All values have been normalized in order to graphically indicate the effects of averaging. The wave form so simulated is defined by normalized values of $n_{ri}$ on y-axis 41 and by each ith interval on x-axis 40. The peak voltage amplitude of the wave form so simulated has a desired signal amplitude of 4 volts peak, and an interference amplitude of 1 volt peak. Thus, the signal to noise ratio of 12 db can be derived from the equation 20 log (peak signal voltage/peak noise voltage). In a simulation, a carrier frequency was set at 500 kHz for the desired signal, with a modulation index of 1.2 and with sinusoidal modulation at a frequency of 25 kHz. In the simulation, the interfering signal was set at a carrier frequency of 500 kHz, a modulation index of 1.1 and with sinusoidal modulation at a frequency of 34.4 kHz. Interval signal 42 is composed of measured values $n_{ri}$ of the desired signal as modified by the interference signal. Signals 44 is signal 42 after amplifications by a factor of 5. Signal 46 is a 10 value running average of signal 44. The smoothing effect of averaging is apparent when comparing signal 46 with signal 44. Lines 43 and 45 are references for the demodulated signal.

In FIG. 5, the effect of averaging on a TISK carrier is shown. The carrier signal has a peak amplitude of 4 volts, a carrier frequency of 500 kHz, and a deviation ratio of 0.0588. The interfering signal is a linear FM carrier (CHIRP) from 460 kHz to 540 kHz, and has an amplitude of 1 volt peak for a SNR of 12 db. Normalized values for $n_{ri}$ appear as shown with reference to y-axis 51, and x-axis 50 indicates the ith interval. Signal 52 is comprised of values $n_{ri}$. Signal 54 is comprised of a running average of ten values of $n_{ri}$. Signal 56 is comprised of a running average of fifteen values of $n_{ri}$. Signal 58 is comprised of a running average of twenty values of $n_{ri}$. Also note reference lines 55, 57 and 59. Notably, the frequency variation of the interference signal extends across the bandwidth of the desired signal. In this simulation, a record length of 5 bits was simulated.

In FIGS. 4 and 5, the smoothing effect of averaging consecutive values of $n_{ri}$ is evident. Averaging values is equivalent to lowpass filtering in analog circuitry. In fact, all carrier demodulators use lowpass filtering as a final operation. Thus, in practice, averaging is not required as an additional operation if lowpass filtering is in place. However, averaging can be used in both analog and digital message types as shown above in addition to other smoothing techniques.

II. Mapping to Reduce the Effects of Interference

Strong interference can create large deviations from a desired value of $n_{ci}$ for a time interval, the effects of which will remain after averaging values of $n_{ri}$. In the case of a cooperative receiver, the range of values of $n_{ci}$ is known. Thus, it is possible to identify the "out-of-bounds" values, and then map those values to suitable "in-bounds" values before filtering or averaging. Thus, an interval (half-cycle of a carrier) by interval basis ability to repair damage due to interference is taught by the present invention.

Many reasonable mapping rules are possible with the present invention. An optimum rule would depend on the knowledge of the TIM carrier and of the interference involved. It is impossible to identify the best rule or all good rules therein. Thus, a variety of rules as taught by the present invention showing the effect for a few types of signals and interference will be presented.

In practice, a message is usually analog only (TIM) or digital only (TISK). A desired value for $n_{ci}$ of an interval differs for these two types of messages. Thus, it is expected that some rules will be more useful in one case and less so in the other. For example, for TISK, $n_{ci}$ has only two possible values, and thus an effective rule is to map all values of $n_{ri}$ into one or the other of these two values using a single threshold as a criterion. Obviously, such a two-valued mapping rule is not applicable when the message is analog. In order to prevent unnecessarily obscuring of the invention, the results for digital messages and analog messages will be considered separately. However, it is common practice to apply digital voltages to circuits and lines tailored to handle analog voltages. For this reason, when a mapping rule is considered herein for analog messages, it should also be considered to potentially be appropriate for a digital message.

The objective is to make $\hat{S}_{ri}$ converge to $n_{ci}$, where $\hat{S}_{ri}$ is a new value of $n_{ri}$ after mapping. Several rules shall now be considered.

The first rule, "Rule A," uses averaging $n_{ri}$. This rule uses previous values of $n_{ri}$ as a reference. Letting $M_{ji}$ be the mean or average of the j previous values of $n_{ri}$, then $S_{ri}$ is equal to $M_{ji}$. Thus, the impact of a single out-of-bounds value of $n_{ri}$ is lessened or reduced due to averaging. Moreover, the trend of values of $n_{ri}$ is preserved, i.e., this trend is due to $n_{ci}$, the signal, and not $n_{Ii}$, the random interference. The difference here from averaging as described above, is that there are two averaging steps. The first step forms $\hat{S}_{ri}$ equal to $M_{ji}$. The second step is the implementation of all the rules for determining a running average of the values of $M_{ji}$. In simulation, a 10 interval running average is used for forming and interpreting a filtered output, where such a dual running averaging is equivalent to a weighted running average. Wherein, a dual-averaging method provides a reference for comparison with the effectiveness of other rules. The effectiveness therein can be determined through simulation or experimentation with predetermined values.

The second rule, "Rule B," contemplates a clipped $n_{ri}$. Letting U and L represent a maximum (upper) and minimum (lower) values of $n_{ci}$, as previously shown with respect to values of peak frequency deviation in FM, then those values of $n_{ri} > U$ can be mapped into U and all those values of $n_{ri} < L$ can be mapped into L. These values of $n_i$ greater than U or less than L are caused by interference.

The third rule, "Rule C," contemplates delta mapping of $n_{ri}$. With analog messages, the voltage typically increases to a maximum value and then decreases to a minimum value, as can be seen in a sine wave. Thus, mapping methods which follow this monotonic pattern, ignoring random deviations, are desired. A well-known technique that does this in a discrete manner is called delta modulation. Delta modulation schemes are well-known in the prior art of the present invention. In delta modulation, if $n_{ri}$ exceeds $\hat{S}_{r(i-1)}$, then $\hat{S}_{ri}$ equals $n_{r(i-1)} + \Delta$; and if $n_{ri}$ is less than $\hat{S}_{r(i-1)}$, then $\hat{S}_{ri}$ equals $n_{r(i-1)} - \Delta$, where the constant $\Delta$ is the step size. In delta modulation, $\Delta$ is selected as a compromise between the effects of granularity and slope overload. Clearly, with proper selection of $\Delta$, new values $\hat{S}_{ri}$ of intervals will follow trends of values of $n_{ri}$.

A fourth rule, "Rule D," contemplates delta mapping of clipped $n_{ri}$. Combining Rules A and C, out of bounds values of $n_{ri}$ are removed according to rule A, and then the random disturbances of the trends are diminished by delta mapping, according to Rule C.

A fifth rule, "Rule E," contemplates averaging values of $n_{ri}$, and then delta mapping according to Rule C.

The present invention realizes that other combinations of these rules and many other rules are possible according to the teachings and disclosures of the present invention herein. By way of example and not limitation, selecting consecutive $n_{ri}$ values, performing a Fourier transform to create new values, and then filtering the new values in a manner such that the inverse Fourier transform of the new values nearly resembles $n_{ci}$ is another possible mapping technique.

The above rules were incorporated separately into computer simulations involving a variety of signals and interference. In the analog simulations, the message signal is a carrier modulated by a tone, and the interference signal is either another carrier modulated by another tone or a CHIRP carrier. In the digital simulation, the message signal is a TISK carrier, and the interference is either another TISK carrier or a CHIRP carrier.

The choice of signals for interference purposes was based on tractability of simulation along with a desire to know with precision the value of the SNR. Notably, as is known in the art of the present invention, CHIRP is considered an effective wave form to jam radar and communications receivers. Also, as is known in the art of the present invention, the use of sinusoids as signal and interference leads to FM capture effect. However, the objective of these simulations is to intentionally create a value of $n_{Ii}$, and then test the ability of averaging and of mapping rules to make $n_{Ii}$ approach zero.

A. Analog Message(s)

Figure 6:
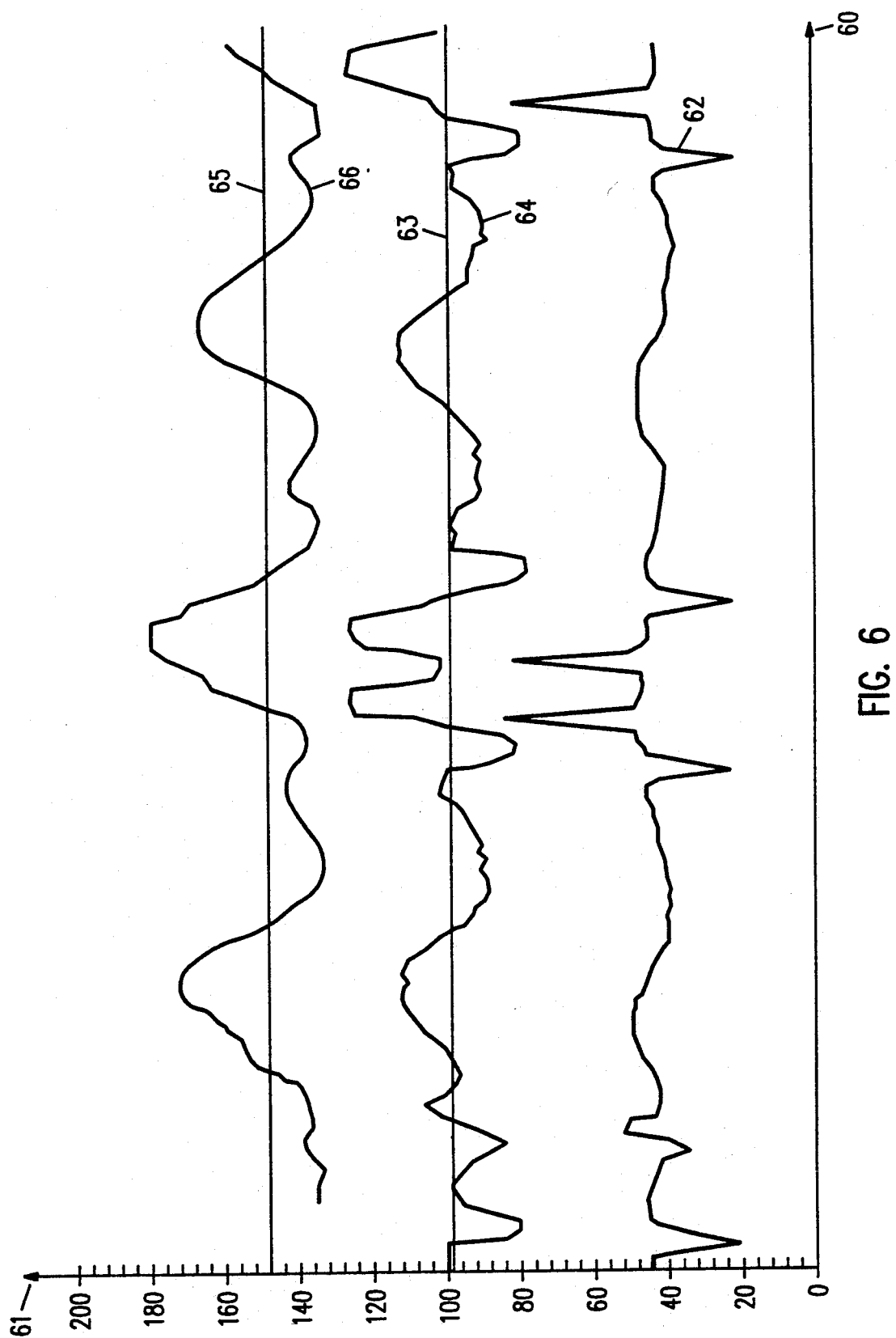
FIG. 6 is a plot of a computerized simulation showing the effect of averaging using four previous values of measured intervals of time between adjacent zero values.

Referring to FIG. 6, averaging $n_{ri}$ according to Rule A is shown. In this simulation, the SNR is approximately one decibel; the carrier frequency is 500 kHz; the modulation index for the carrier signal is 2.5; the modulation index for the interfering signal is 1.59; the modulation frequency for the carrier signal is 25 kHz; and the modulation frequency of the tone interfering signal is approximately 39.0 kHz. Notably, y-axis 61 indicates normalized values of $n_{ri}$, and x-axis 60 indicates the ith interval. In this FM demodulation model, signal 62 is $n_{ri}$ for the carrier signal as interfered with by the interference signal. Signal 64 indicates $M_{4i}$ in accordance with Rule A. Signal 66 is a running average of ten values of $M_{4i}$ according to Rule A. Reference lines 63 and 65 are provided.

Figure 7:
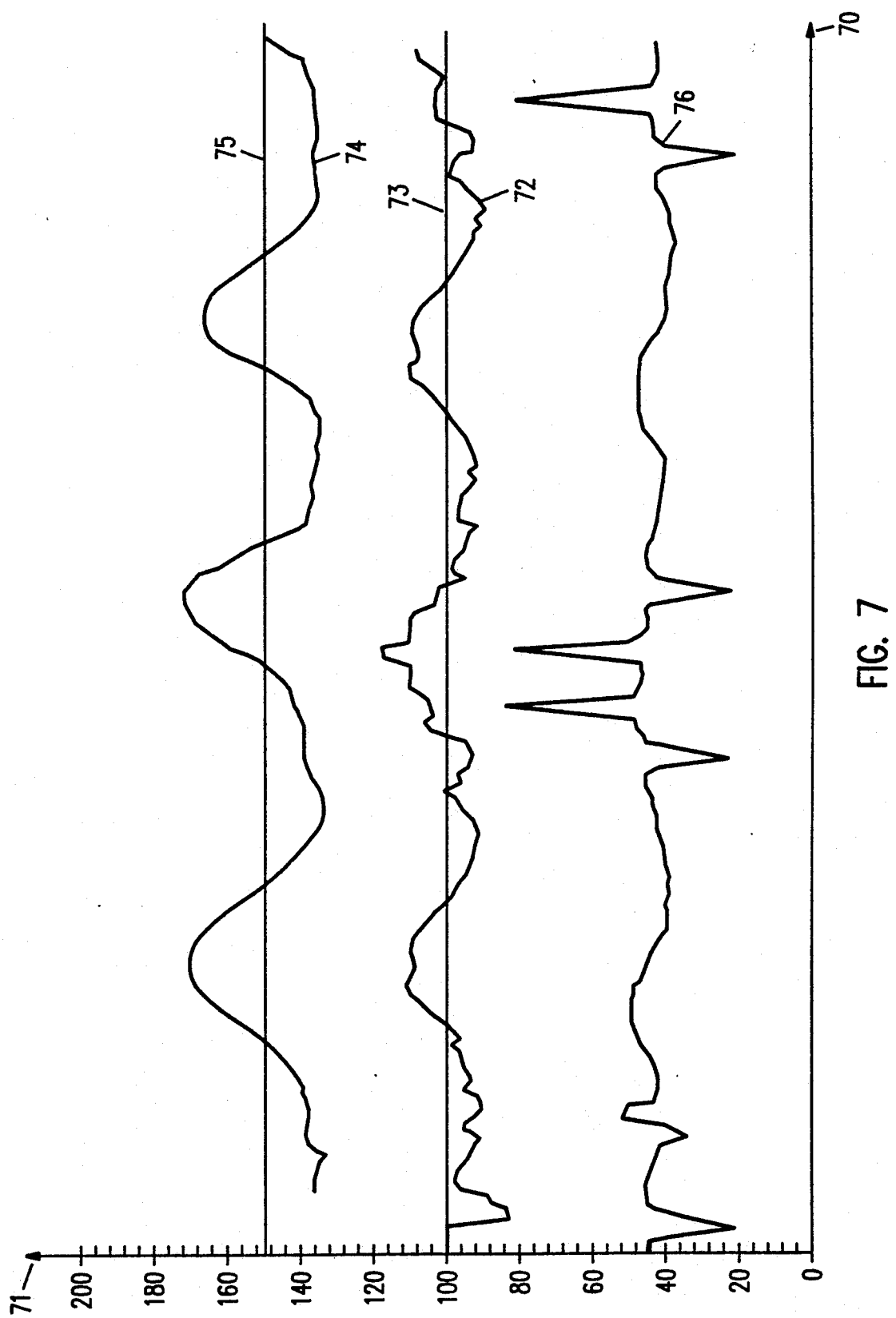
FIG. 7 is a plot of a computerized simulation showing the effect of averaging using ten previous values of measured intervals of time between adjacent zero values.

Referring to FIG. 7, an FM demodulation model of an analog message according to Rule A is shown. The carrier signal and the interfering signal of FIG. 7 have all the same characteristics as that of the simulation as shown in FIG. 6, with the exception that $M_{4i}$ is now $M_{10i}$. Comparison of signals 64 and 66 with that of 72 and 74, respectively, indicates that there is a smoothing effect created by the inclusion of more terms in the average, i.e., ten versus four.

Figure 8:
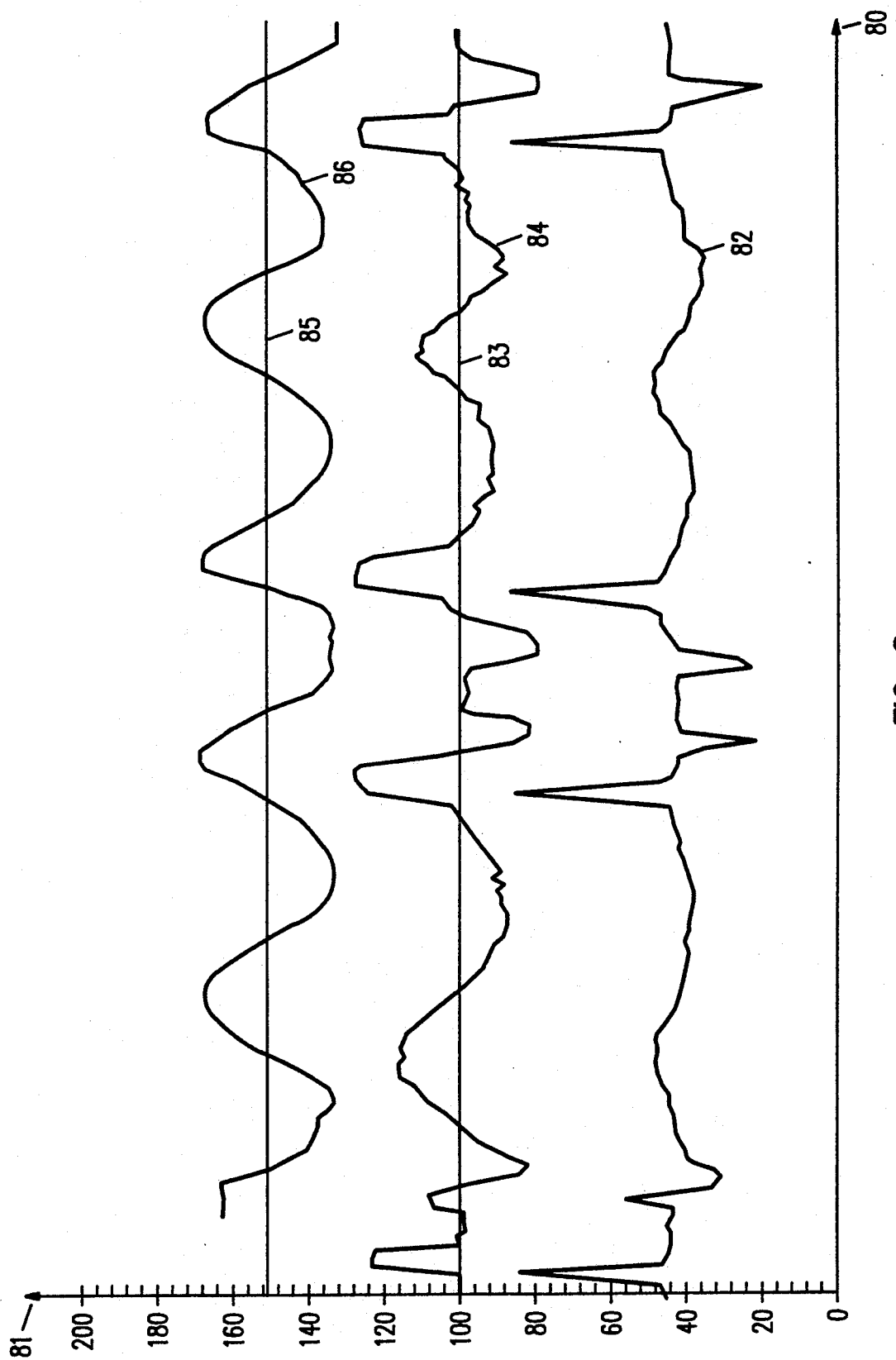
FIG. 8 is similar to FIGS. 6 and 7 but with an interfering signal stronger then the carrier signal.

FIG. 8 is essentially the same as FIG. 7, except that now the interfering signal is one decibel above the carrier signal. FIG. 8 is similar to FIG. 6, as FIG. 8 has signal 82 for $n_{ri}$, signal 84 for $M_{4i}$, and signal 86 for a running average of ten values of $M_{4i}$. The message recovered is that of the interfering carrier. This shows that a one decibel stronger signal is captured by the simulated TIM demodulator.

As can be seen from comparing signals 66, 74 and 86, averaging effectively removes out-of-bounds values of $n_{ri}$ as expected. Moreover, the more terms involved in the running average, the more pronounced the effect. Thus, as shown, TIM demodulation, using a running average according to Rule A, is an effective method for demodulating and smoothing the message carried on a carrier signal.

Figure 9:
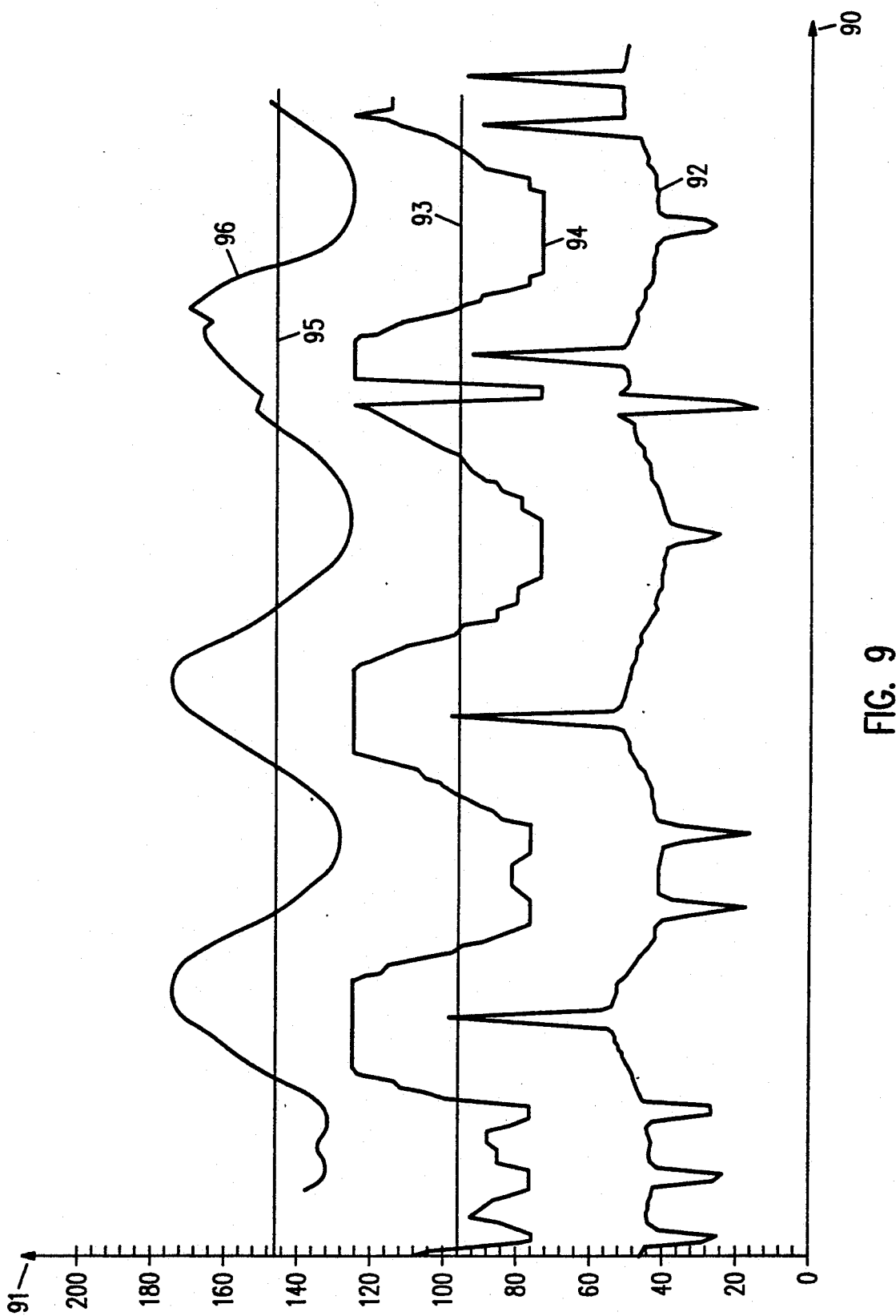
FIG. 9 is a plot of a computer simulation using clipping.

FIG. 9 shows an analog message with $n_{ri}$ clipped according to rule B where the clipping levels are 40 and 50, and an average of ten samples of $n_{ri}$ are used. The SNR for the simulated signals is approximately one decibel, the carrier frequency is 500 kHz. The desired signal has a modulation index of 4.7 and a modulation frequency of 25 kHz. The interfering signal has a CHIRP of 440 to 560 kHz. Performance is improved by increasing the modulation index to 4.7, which translates to larger excursion of values of $n_{ci}$. These wide excursions can be seen with reference to signal 92 for $n_{ri}$, and signal 94 for $n_{ri}$ clipped. Signal 96 is a running average of ten values of $n_{ri}$ clipped. Reference lines 93 and 95 are provided. As can be seen by comparing the above simulations to the simulation represented in FIG. 6, a larger modulation index translates into a larger excursion of the signal, which in turn translates into improved performance for demodulation.

Figure 10:
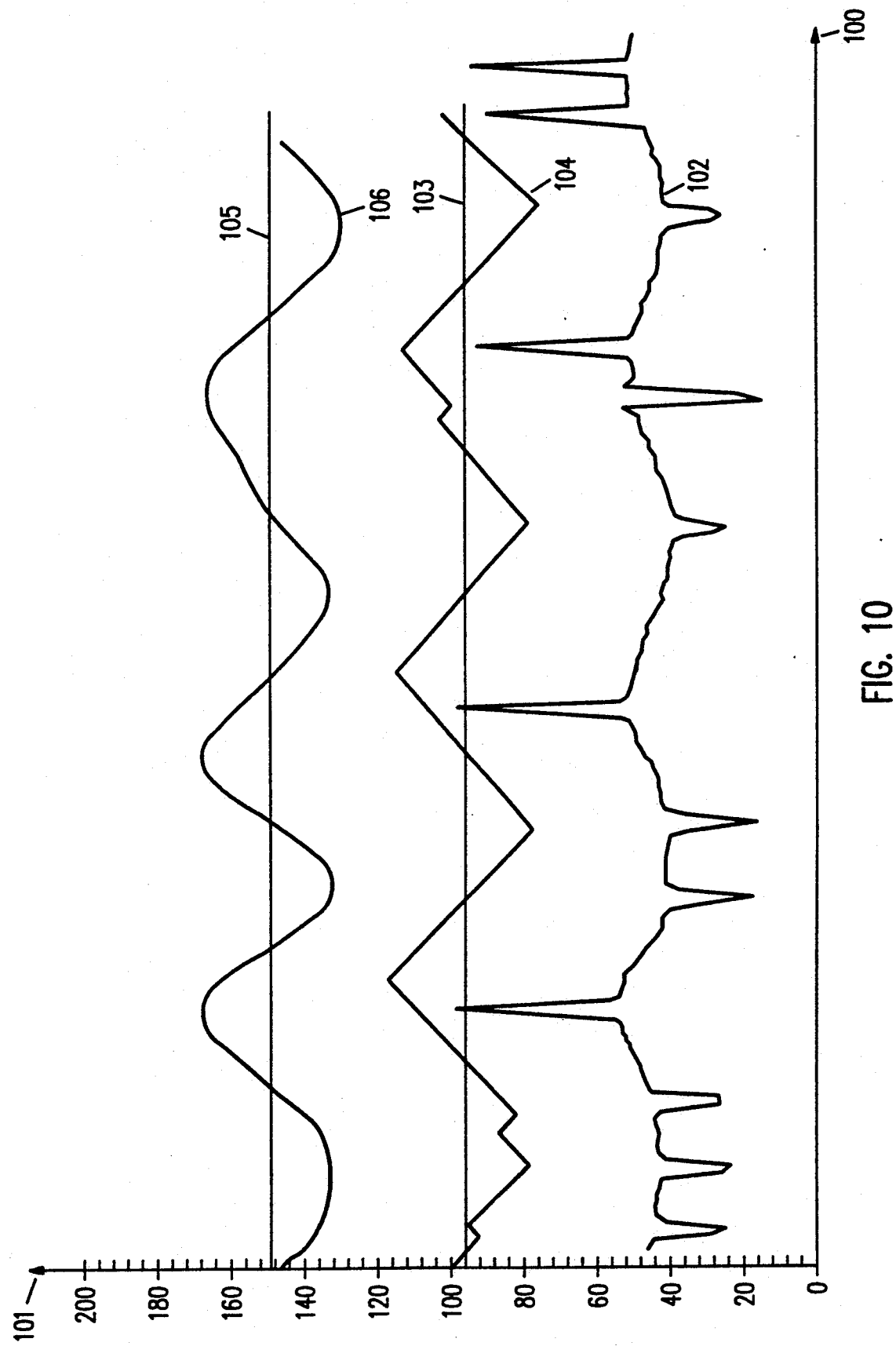
FIG. 10 is a plot of a computer simulation using delta mapping.

FIG. 10 shows delta mapping of $n_{ri}$ of an analog message according to Rule C. The SNR in this simulation is also one decibel with a carrier frequency of 500 kHz, a modulation index on the carrier signal of 4.7, a modulation frequency on the carrier signal of 25 kHz and an interfering signal with CHIRP from 400 to 560 kHz. Signals 102, 104 and 106 are defined by y-axis 101 for normalized values of $n_{ri}$ and x-axis 100 for each ith value therein. Signal 102 indicates the values of $n_{ri}$, for each i, as measured. Signal 104 represents delta mapped values of $n_{ri}$ with a delta modulation step size of 0.5. Signal 106 is a running average of ten delta mapped values of $n_{ri}$. As can be seen from signal 106, the simulated TIM demodulator is able to demodulate the analog signal.

Figure 11:
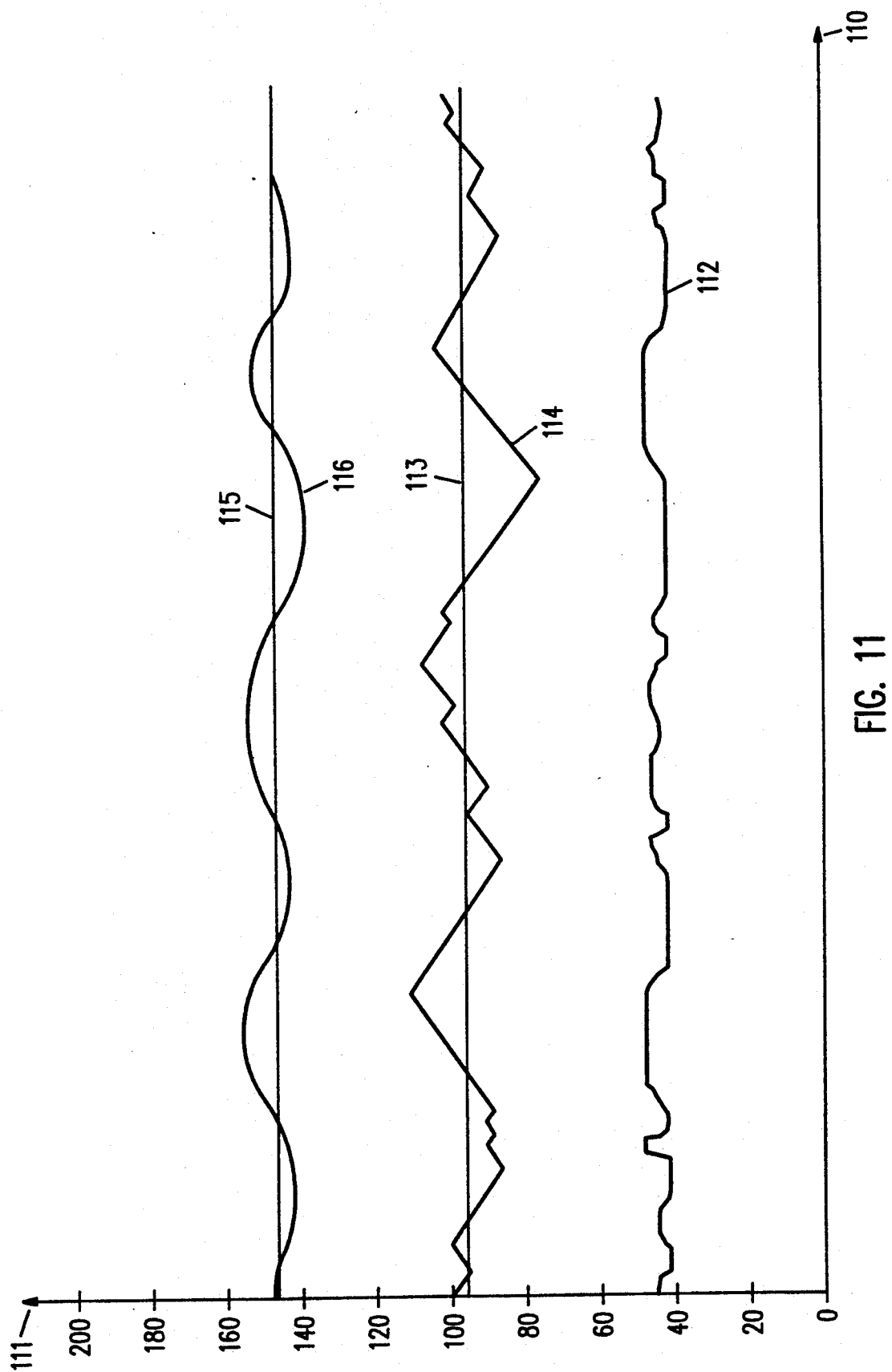
FIG. 11 is a plot of a computer simulation using clipping then delta mapping.

FIG. 11 shows the demodulation of an analog message wherein $n_{ri}$ is first clipped and then mapped according to Rule D. The SNR in this simulation is one decibel, the carrier frequency is 500 kHz; the modulation index of the carrier signal is 2.5; the modulation index of the interfering signal is 1.59; the modulation frequency of the carrier signal is 25 kHz; and the modulation frequency of the interfering signal is 39.0 kHz. The signals 112, 114 and 116 are defined by x-axis 110 for each i interval and y-axis 111 for normalized values of $n_{ri}$. Signal 112 is a representation of clipped values of $n_{ri}$, wherein the clipping levels are set at normalized values of $n_i$ of 42 and 48. Signal 114 is a delta mapped version of the clipped signal $n_{ri}$. Signal 116 is a running average of ten delta mapped values of $n_{ri}$ as clipped. As can be seen, the simulated TIM demodulator using a delta mapped application of a clipped $n_{ri}$ with a step size of 0.25 is able to demodulate the desired message signal. Notably, the quality of the output is somewhat better if clipping precedes delta mapping, as was done in the above simulation.

All of the above simulation results indicate that the SNR improvement of wideband FM can extend down to SNRs near equal to zero decibels when using time-interval-modulation as taught by the present invention. While these simulations were done according to analog messages, it should be realized that the above-mentioned rules as taught by the present invention can be applied to digital messages.

B. Digital Messages

When a message carried is digital, $n_{ci}$ has two values. This is the binary representation of $n_{ci}$. Thus, considerably more is known about the structure of a carrier signal which transmits digital messages. Using this knowledge in selecting a duration of averaging and a mapping rule for demodulation, certain advantages can be achieved. The important signal parameters with digital messages are bit rate (binary messages), deviation ratio $r_d$ (where $r_d$ is defined, as before, as the peak frequency deviation divided by the carrier intermediate frequency at the input to the TISK demodulator). The bit rate limits the number of intervals which can be averaged. The deviation ratio relates to the peak-to-peak value of the demodulator output. Thus, for a given SNR, the quality of the TISK demodulator output improves with increasing values of $r_d$. This is the wideband FM effect but now observed with small values of SNR. As previously noted, $r_d$ can be increased by heterodyning, i.e., decreasing the carrier frequency, $f_c$. An additional feature of a digital message is the absence of a fidelity criterion. The measure of output quality in digital messages is based on a probability, $P_e$, of bit error. This probability is also the bit error ratio, BER. Thus, the polarity of the output, not the shape of the wave form, is important in digital messages. Moreover, an integrate and dump circuit (a lowpass filter circuit) is a well-known post detection circuitry used to recover data bits, wherein the polarity of the output voltage distinguishes the bits. This type of circuitry should be understood when reviewing the following simulations.

Figure 12:
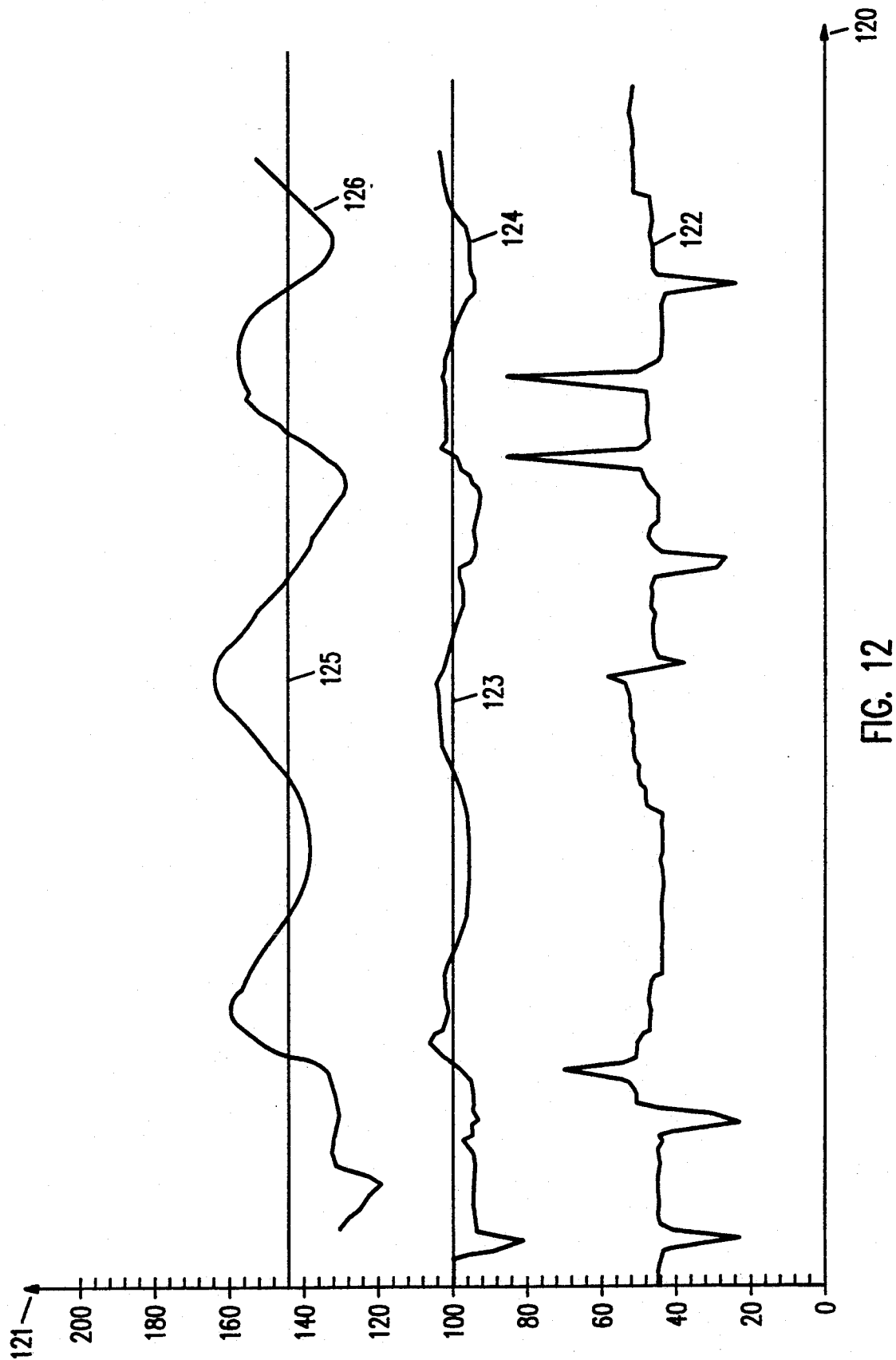
FIG. 12 is a plot of a computer simulation showing the effect of averaging for demodulation of a digital message.

FIG. 12 represents simulation of a digital message according to Rule A for averaging $n_{ri}$. In this simulation, a TISK carrier signal is interfered with by another TISK carrier signal, wherein the SNR is one decibel. In this simulation, the carrier frequency was 500 kHz, the deviation ratio for the desired signal was 0.1 and the deviation ratio for the interference signal was 0.0625. The values have been normalized to conform to graphical representation as defined by y-axis 121 and x-axis 120. Y-axis 121 represents normalized values for $n_{ri}$. X-axis 120 represents the ith interval for each $n_{ri}$. Signal 122 is the value of $n_{ri}$ according to the above mentioned conditions. Signal 12,4 is $M_{10i}$ as a function of $n_{ri}$. Signal 126 is a running average of ten values of $M_{10i}$. Reference lines 123 and 125 are provided. As indicated by signal 126, the TISK carrier signal is demodulated in the presence of such interference in accordance with the teachings of the present invention.

The previously mentioned rules can be further simulated for TISK carrier signals with TISK carrier signal interference and/or CHIRP interference. In order to not unduly obscure the invention, further simulations according to the above mentioned rules will not be described herein but such simulations should be apparent from the above disclosure of the present invention. Rather, simulations according to other combinations of rules will be described hereafter.

Figure 13:
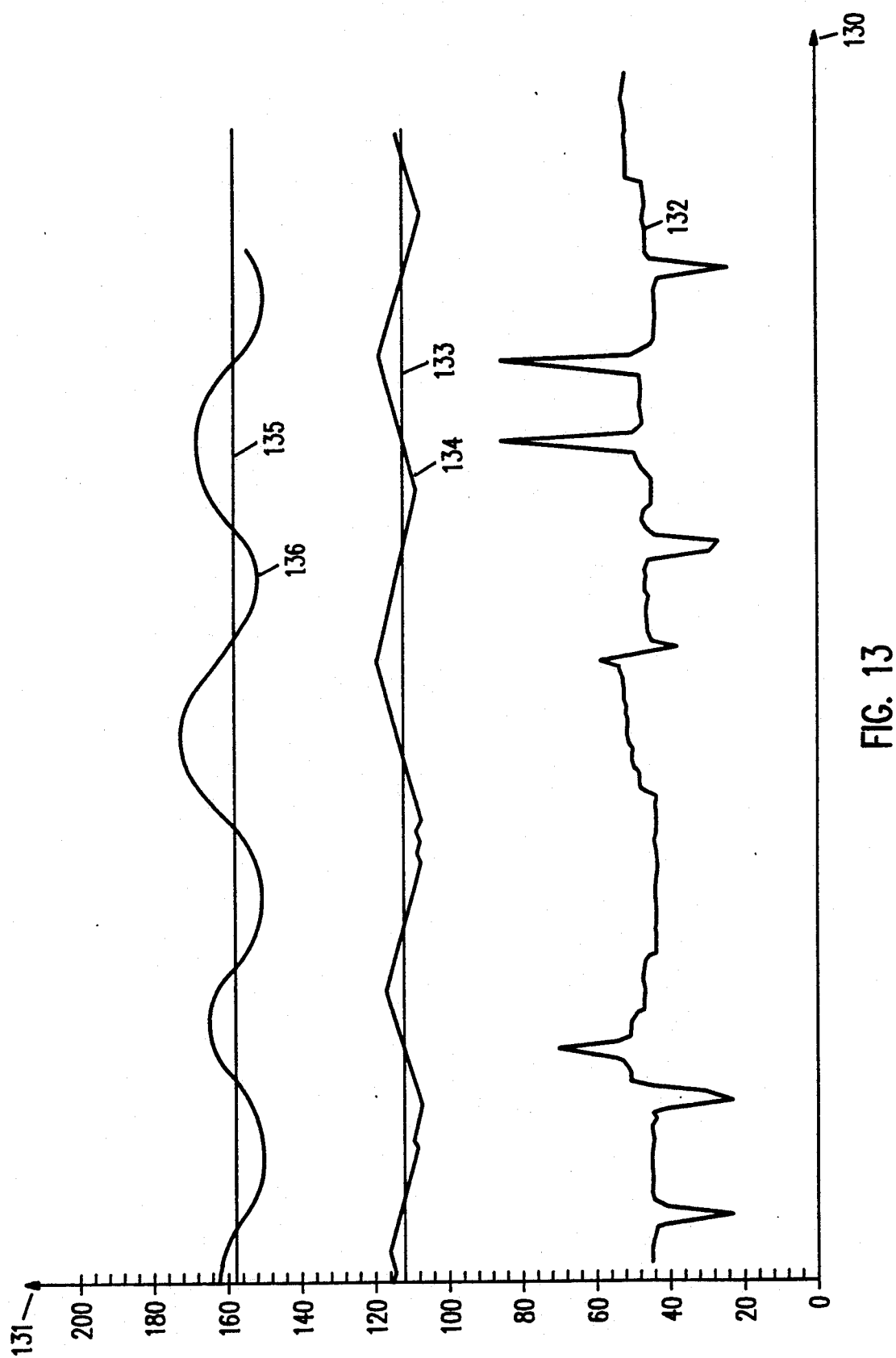
FIG. 13 is a plot of a computer simulation using averaging and then delta mapping.

FIG. 13 shows averaging $n_{ri}$ and then delta mapping of a digital message therein according to Rule E, i.e., a combination of averaging and Rule C above. All the parameters for the desired signal and the interference signal as disclosed in FIG. 12 are the same for FIG. 13. The delta modulation step size for this simulation is 0.25. Moreover, axes 131 and 130 are similar to axes 121 and 120 as previously described. Signals 122 and 132 are the same. Signal 134 is the delta mapped average of $n_{ri}$. Note that signal 134 is smoother than signal 124 of FIG. 12. Signal 136 is a running average of ten values of the delta mapped average of $n_{ri}$. Reference lines 133 and 135 are provided. As indicated in FIG. 13, and compared with FIG. 12, the running average of ten values of the delta mapped average of $n_{ri}$, signal 136, is a smoother or cleaner demodulation of the desired signal as compared to signal 126 of FIG. 12.

While this combination was simulated for a digital signal, it should be understood that such a combination is applicable to an analog signal or message. Whereas, two valued mapping is unique to digital signals.

In all receivers used to recover digital messages (bit streams), the two-valued message (bits) is obtained using integrate and dump circuitry and clock recovery circuitry operating on the output of the receiver demodulator. These circuits are well-known in the prior art.

Figure 14:
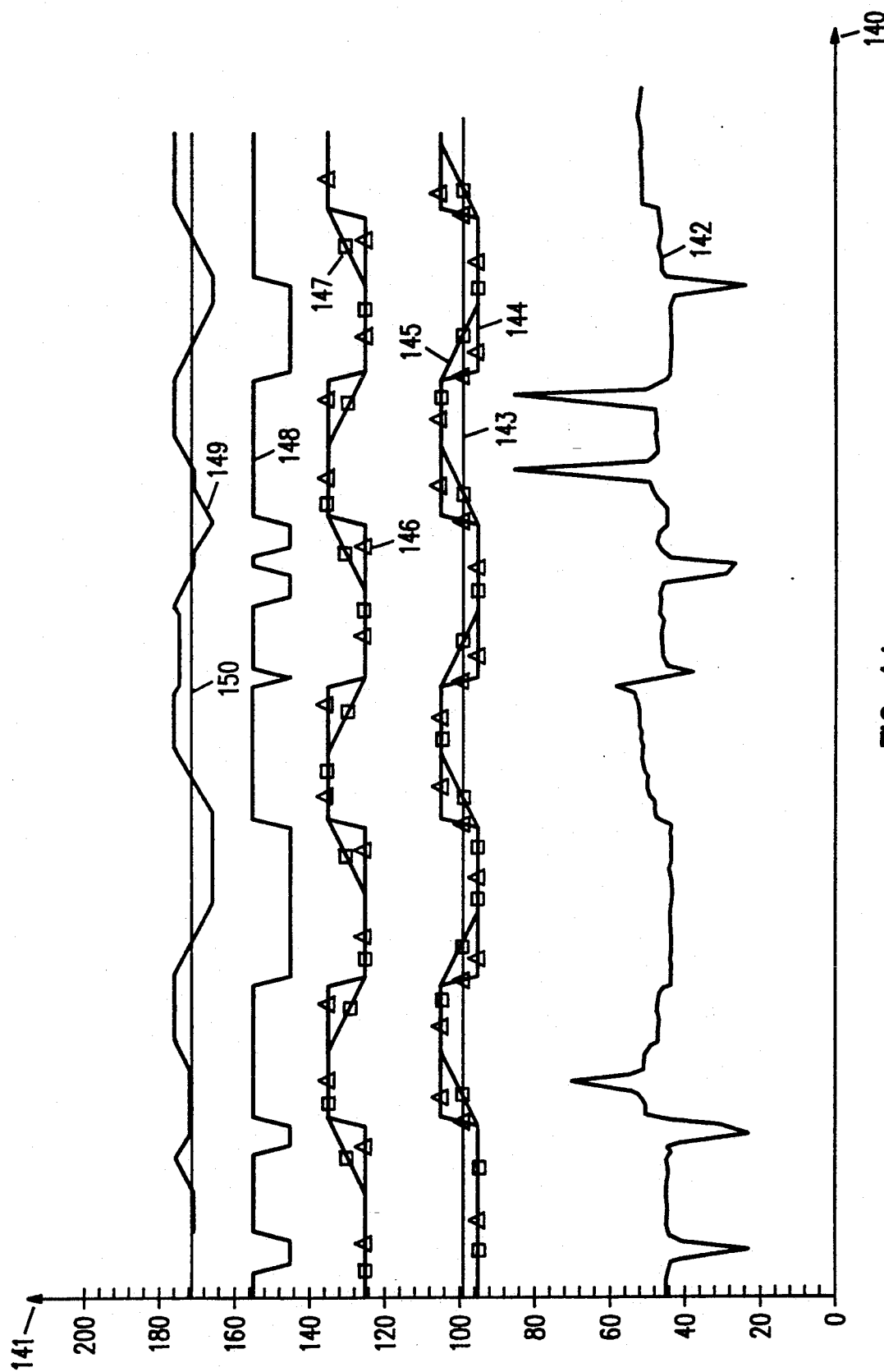
FIG. 14 is a plot of a computer simulation using two-valued mapping.

FIG. 14 shows demodulation of a digital message according to two-value mapping of $n_{ri}$. All the values for the desired signal and the interference signal as in FIGS. 12 and 13 are the same in FIG. 14. With digital messages $n_{ci}$ has two values. Consequently, any values other than these are due to the interaction of interference. A reasonable mapping method should establish a threshold value, $n_T$, and map all values greater than $n_T$ into some arbitrary upper constant value, $n_U$. All values less than $n_T$ can then be mapped to another lower constant value, $n_L$. This is similar to Rule B above. Note, that by making $n_U - n_L$ relatively large, we can provide gain by mapping. This gain is equivalent to voltage amplification.

Several choices of a threshold value $n_T$ are possible, but logically $n_T$ should be midway between the two values of $n_{ci}$. This requires that the receiver be tuned to this midway value if the IF for the receiver is not precisely known. To avoid tuning, we can drive the threshold from the signal being demodulated. The direct current, dc, value of all the $n_{ri}$ used in the simulation can be used as a threshold, and the dc value of all the $n_{ri}$ after clipping according to Rule B can be used as a threshold.

The results of using the above-mentioned thresholds are collectively shown in FIG. 14. The signals in FIG. 14 are defined by y-axis 141 and x-axis 140, which are similar to y-axis 121 and x-axis 120 as previously described. Signal 142 is similar to signal 122 as previously described. Signal 143 is the threshold value $n_T$ from the tuned receiver and superimposed thereon as signal 144 (indicated with triangles) is the result of two-valued mapping. Signal 145 (indicated with squares) is a running average of ten values of signal 144. Signal 146 (indicated with triangles) is the result of two-valued mapping when the threshold value $n_T$ is taken as the average of all the values of $n_{ri}$ in the simulation record. Signal 147 (indicated with squares) is a running average of ten values of signal 146. Signal 148 is the result of two-valued mapping when the threshold value of $n_T$ is taken as the average of all the values in the simulation record of the clipped $n_{ri}$. Signal 149 is a running average of ten values of signal 148. Signal 150 is provided as a reference (the average of all values of signal 149). As can be seen in the simulated results shown for these cases, a threshold value should be derived from the values of $n_{ri}$ without clipping if an untuned receiver is used. However, performance is enhanced by using a tuned receiver, wherein a known threshold value (signal 143) is injected into the mapping operation.

Simulation results show that a tuned receiver is able to clearly distinguish all the bits of one of two TISK carriers when they are of equal power. The distinction between such TISK carriers is that the signal having the larger value of deviation ratio is favored. Additional power is needed to counter a larger value of deviation ratio between two TISK carriers. With a power advantage of 6 db, both the tuned and untuned receivers can recover the bits of a narrowband carrier, as is shown in FIG. 15.

Figure 15:
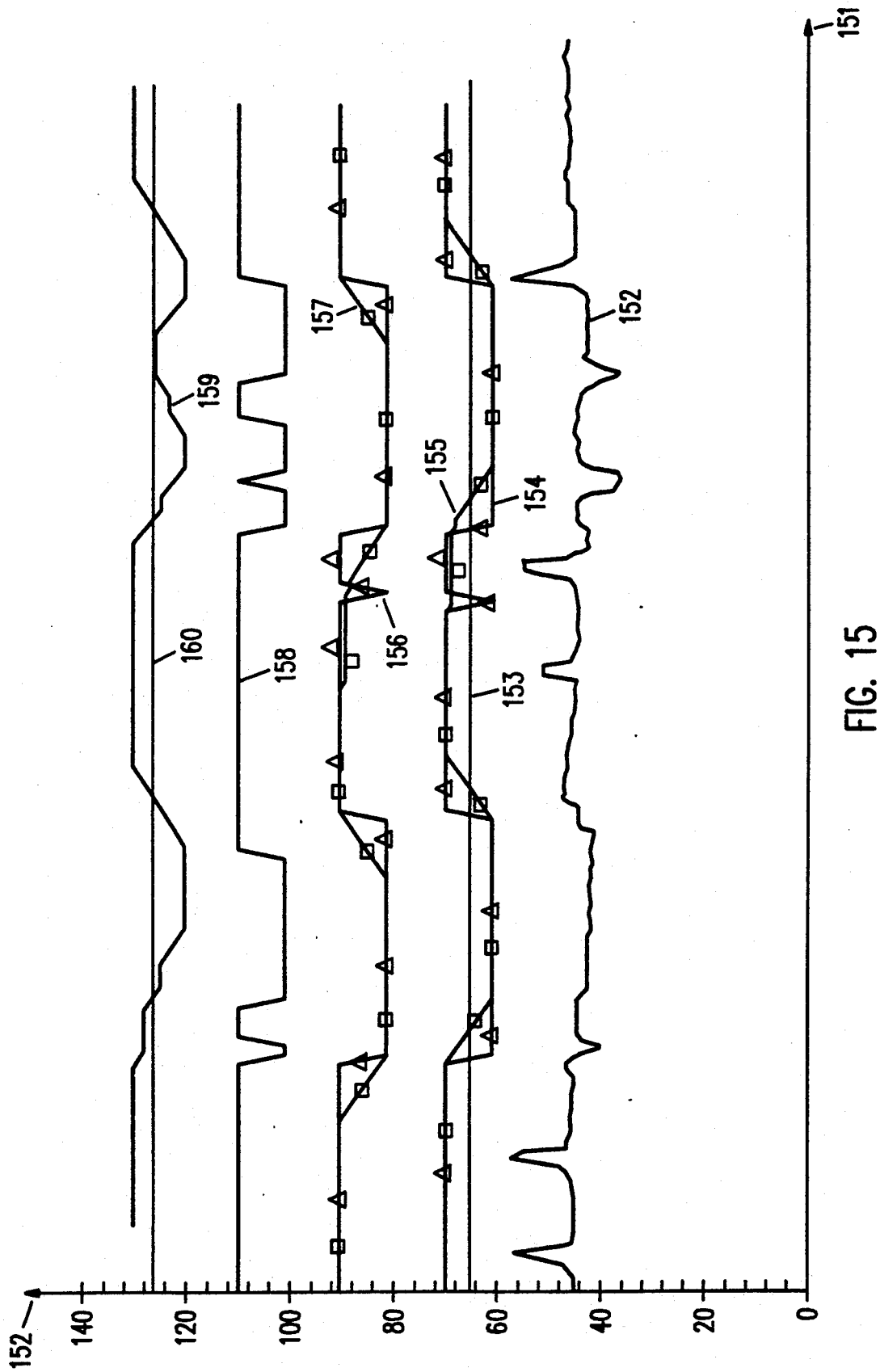
FIG. 15 is a plot of a computer simulation similar to FIG. 14 but with an interfering signal stronger than the carrier signal.

In FIG. 15, a digital message demodulated according to two-valued mapping of $n_{ri}$ is shown. The desired signal and the interference signal have all the same parameters as those in FIG. 14, except that the interference signal has an amplitude of two volts peak and the carrier signal only one volt peak. Thus, the SNR is $-6$ db. Now, the bits carried by the interfering (stronger) carrier are recovered intact. Y-axis 152 indicates the normalized values of the $n_{ri}$ signal, and x-axis 151 is for each ith iteration therein. Signal 152 is $n_{ri}$ for the above-referenced conditions. Signals 154 through 160 each correspond to signals 144 through 150 of FIG. 14.

Various other mapping rules can be used for both analog and digital messages. These are but a few of the potential mapping rules which can be used in practicing the art as taught by the present invention. However, other mapping rules known in the art of the present invention can be used in practicing the art as taught by the present invention. Those mapping rules have been omitted in order to prevent unnecessary obscuring of the present invention. Thus, it should be understood that the present invention teaches demodulating a message signal from a carrier signal, wherein the demodulated message signal is substantially equivalent to the original message signal. Hence, the message signal can be recovered with little to no error.

III. Demodulation

Demodulation is a three step process with respect to the present invention: creating a voltage equivalent to $n_{ri}$ (this voltage is designated as $v_n(t)$); implement a mapping rule; and averaging a predetermined number of values. Averaging, as previously described, can be accomplished with a lowpass filter. Generation of $v_n(t)$ and mapping can be done with digital circuitry or with a combination of analog and digital circuitry.

Figure 16:
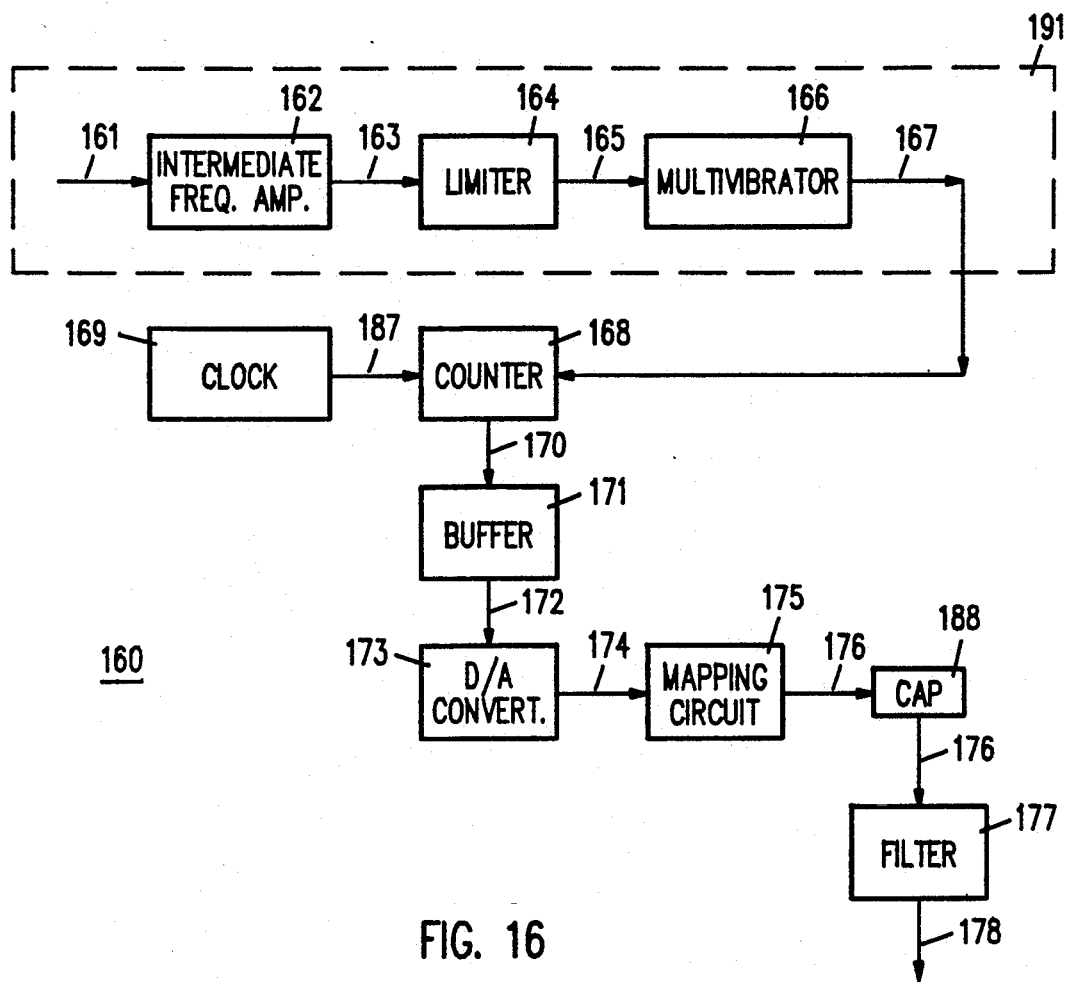
FIG. 16 is a block diagram of a demodulator according to the present invention.

Referring to FIG. 16, a block diagram of a TISK demodulator 160 using "digital" circuitry is shown. A carrier wave 161 is applied to intermediate frequency amplifier 162. Intermediate frequency amplifiers are well-known in the art of the present invention for providing a set frequency for demodulation of an input carrier wave. Output 163 of intermediate frequency amplifier 162 is $v_r(t)$, which is a time dependent voltage reference based on a predetermined frequency as set by intermediate frequency amplifier 162. Intermediate frequency amplifier 162 can be any of various types, as are known in the art of the present invention. Output 163 of intermediate amplifier 162 is fed to hard limiter 164. Hard limiter 164 limits the voltage amplitude of $v_r(t)$ to predetermined levels. Output 165 of hard limiter 164 is fed to monostable multivibrator 166. Monostable multivibrator 166, commonly known as a one-shot, single-shot or pulse generator, has one stable state and one quasi stable state. The circuit remains in its stable state until a triggering signal causes a transition to the quasi stable state, and after a pre-determined time, the circuit returns to its stable state. Hence, a single pulse can be generated. Monostable multivibrator 166 is triggered only at the zero-crossings of $v_r(t)$. In this manner, the zero-crossing information can be transferred to counter 168 on the leading edge and the counter reset on the trailing edge of an output pulse 167 generated by monostable multivibrator 166. Clock 169 sends clock pulses 187 to counter 168. By pulsing counter 168 through clock 169, each time interval between pulses generated by monostable multivibrator 166 can be determined as a count of the ticks of clock 169. Thus, the number of pulses from clock 169 between polarity transitions of $v_r(t)$ is counted by counter 168. Output 170 is mathematically represented as $n_{ri}$ and can be transferred to buffer 171. Each count representation of $n_{ri}$ 172 can then be transferred from buffer 171 to digital to analog converter (DAC) 173. Digital to analog converter 173 converts each $n_{ri}$ representative count 172 to an equivalent analog voltage, which can be termed $v_n(t)$. Output 174, $v_n(t)$, is transferred to mapping circuitry 175. Mapping circuitry 175 implements a chosen mapping rule for mapping $v_n(t)$. Mapping circuit 175 provides an output 176 to circuit 177. Circuit 177 can be an integrate and dump circuit for digital messages or some other appropriate lowpass filter for analog messages. Incorporated by reference herein is patent application Ser. No. 07/864,275, filed Apr. 6, 1992. That application discloses computational techniques for lowpass filtering, among other aspects of the computational techniques disclosed therein. Circuit 177 provides output 178, which output is the demodulated message from carrier signal input 161.

Figure 17:
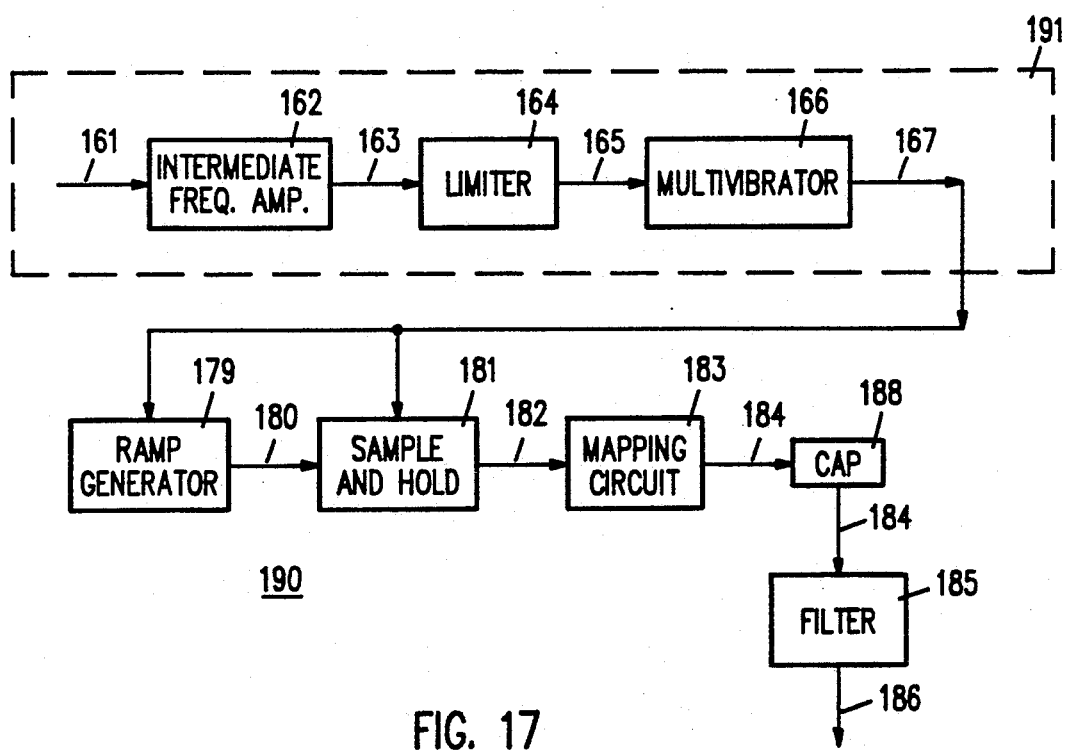
FIG. 17 is a block diagram of another embodiment of a demodulator according to the present invention.

In FIGS. 16 and 17, a coupling capacitor 188 removes the dc value of the mapped version of $v_n(t)$, i.e., the average value of the mapped version of $n_{ri}$.

The maximum error in measuring $n_{ri}$ is plus or minus $1/r_c$, where $r_c$ is the clock rate in pulses per second. This maximum error can be defined in terms of signal parameters. For example, where $f_c$ is the carrier frequency prior to demodulation, and $r_c$ is the clock rate, then with no modulation, a value of N counts between adjacent zero values should occur, where $N=r_c/(2f_c)$. With digital clocks, time is discrete, and so the result can be $N-1$, N or $N+1$ due to a plus or minus one count error which exists with digital clocks. Assuming that the count error is random, then averaging over several intervals or counts will diminish the effect of the error. Of course, other means of reducing the effect of count error are to increase $r_c$ or decrease $f_c$, or any combination of any of the above.

Resolution of a time interval modulation demodulator which uses an external clock is limited by the discrete nature of time measurement. From equations (1) and (2) above, U−L is the peak-to-peak variation of the recovered message. This will have some integer value or count, $N_c$. There are then a maximum of $N_c$ different distinguishable values of the recovered message. This counts granularity is like quantization error in pulse-code modulation. In fact, the resolution capability of such a time interval modulation demodulator can be rated in terms of the number of bits, $N_b$, equal to $\log_2 N_c$. For example, if $N_c$ equals 32, then $N_b$ equals 5, and the recovered message has a resolution equivalent to a 5 bit pulse code modulation representation. From equations (1) and (2) above, $$U-L=(1/IF)[r_d/(1-r^2_d)]=\Delta f/[(IF)^2-(\Delta f)^2]$$

where $\Delta f$ is the carrier peak frequency deviation at the receiver intermediate frequency. Decreasing IF or increasing $\Delta f$ will increase U−L. The maximum count difference is:

$$N_c=r_c(U-L).$$

Increasing (U−L) or $r_c$ increases $N_c$. If (U−L) is the time between the ith and the (i+m)th zero values, then $N_c$ on average is increased by a factor of m, and $N_b$ increases by $\log_2 m$. The ith and (i+m)th zero values can be identified as successive when m is a power of two by using divide-by-$N_d$ circuits which are well-known in the prior art of the present invention.

As an example, let $r_c$ equal 50 MHz, IF equal 100 kHz, $r_d$ equal 0.1 and m=8. Then, $$U\text{-}L = \frac{10^4 \text{ Hz}}{(10^5 \text{ Hz})^2 - (10^4 \text{ Hz})^2} = \frac{1}{9.9 \times 10^5} \text{ seconds}$$

$U\text{-}L = 1.0101 \times 10^6$ seconds $\approx 1$ μs;
$N_c = 50.5050$; and
$N_b = \log_2 50.5050 + \log_2 8 = 8.6584$.

Thus, at least 8 bits of resolution of the message can be resolved with the above conditions.

Alternative embodiments of the present invention may combine clock 169, counter 168, buffer 171, DAC 173 and mapping circuitry 175 or various combinations thereof into a single digital signal processor. Digital signal processors are well-known in the art of the present invention. Typically, such digital signal processors are a single integrated circuit having memory, in which such integrated circuit can be programmed. In such a case, $v_n(t)$ would appear in a digital form within the digital signal processor integrated circuit or at the output of a DAC contained therein.

Referring to FIG. 17, a block diagram of a TIM demodulator 190 using "analog" circuits is shown. The first three stages of time interval modulation demodulator 190 are equivalent to TISK demodulator 160. However, monostable multivibrator 166 is coupled to ramp generator 179 and sample and hold circuit 181. Ramp voltage generator 179 converts a time interval between adjacent pulses 167 from monostable multivibrator 166 to a voltage. Ramp generator 179 can be reset on the trailing edge of pulse 167 from monostable multivibrator 166. Sample and hold system 181 can be triggered or enabled on the leading edge of pulse 167 generated by monostable multivibrator 166. Sample and hold 181 is coupled to ramp generator 179 through line 180. Sample and hold circuit 181 converts analog information from ramp generator 179 to a constant voltage over a time interval, namely, the interval between pulses generated by monostable multivibrator 166. Thus, output 182 of sample and hold system 181 are those held values of $n_{ri}$. This equivalent voltage of $n_{ri}$ created as an output 182 of sample and hold circuit 181 is $v_n(t)$. Output signal 182 is processed by mapping circuitry 183. Mapping circuitry output 184 is sent to lowpass filter 185. Output from lowpass filter 185 is a demodulated message 186 from carrier input signal 161.

Letting IF equal the intermediate frequency or carrier frequency of the signal at the input to the demodulator, and letting $F_r$ be the frequency equivalent to the most rapid variation of a message being carried, then it is desirable to insert a divide-by-$N_d$ circuit between hard limiter 164 and monostable multivibrator 166 in FIGS. 16 and 17 as IF is much greater the $F_r$. To determine $N_d$, first select a number of samples per second, $N_s$, of the message that is desired for representation. Typically, this is a multiple of the Nyquist sampling rate. Next, a number $N_c$ of cycles of carrier per cycle of modulation is selected. If $N_d$ is less than IF/$(N_sN_c)$, then the design conditions are satisfied. For example, for a single-channel voice signal of telephone quality, the Nyquist rate is about 6,800 samples per second. Choosing $N_s$ equal to twice the Nyquist rate or 13,600 samples per second, and letting $N_c$ equal ten, then if IF equals 10.7 MHz for a commercial FM broadcast, $N_d$ will be less than 78.6765.

As described above, division of intermediate frequency is desirable because random variations and out-of-bounds values of $n_{ri}$ are reduced by a smoothing effect due to sampling many intervals block by block. Notably, this is not a running average, and it is not equivalent to heterodyning. Division by $N_d$ may be convenient in lieu of heterodyning in some applications, including retrofitting.

Moreover, using $1/n_{ri}$ instead of $n_{ri}$ is easily accomplished using circuitry in the arithmetic unit of a hand-held calculator. For example, this operation can be performed by digital signal processors which may otherwise be used to combine clock 169, counter 168, buffer 171, DAC 173 and mapping circuitry 175 or various combinations thereof.

Figure 18:
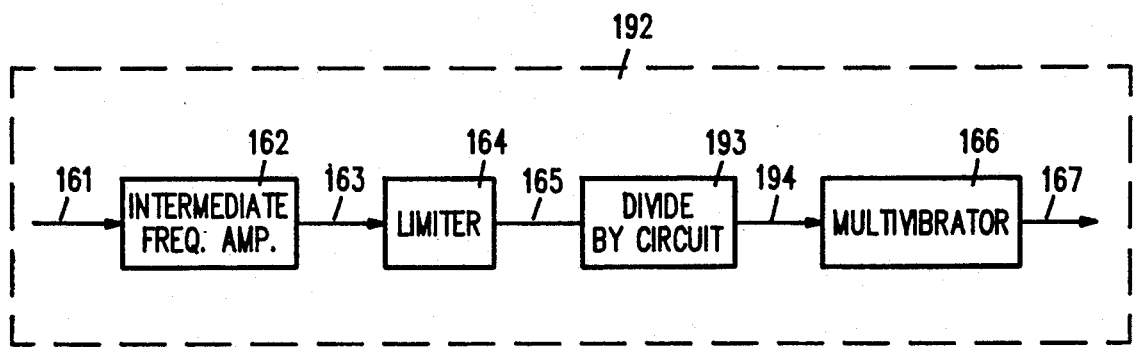
FIG. 18 is a block diagram of an alternate embodiment of an input stage according to the present invention.

In FIG. 18, input stage 192 is an alternative embodiment of input stage 191 in FIGS. 16 and 17, and can be substituted for input stage 191 therein. In FIG. 18, output 165 of hard limiter 164 is fed to a divide-by-$N_d$ circuit 193 for division of the intermediate frequency amplified by frequency amplifier 162. $N_d$ can be set to a desired value as disclosed above for processing the output signal 194 at a desired, generally lower, frequency.

Mapping circuitry of FIGS. 16 and 17 can be implemented with a variety of well-known circuits. By way of example and not limitation, mapping circuitry can be implemented for each Rule, noting again that $v_n(t)$ is the voltage equivalent of $n_{ri}$, as follows: mapping according to Rule A can be accomplished with a lowpass filter for averaging j previous values of $n_{ri}$ to provide $M_{ji}$; mapping according to Rule B can be accomplished with a comparator configured as a "voltage window" to provide clipping of $n_{ri}$; mapping according to Rule C can be accomplished with a delta modulator integrated circuit to provide delta mapping of $n_{ri}$; and mapping according to Rules D or E can be accomplished with appropriate combinations of the above circuits. Also, two-valued mapping can be accomplished with a one-bit digital-to-analog converter, e.g., substituted for digital-to-analog converter 173 in FIG. 16. In which case, mapping circuitry 175 is not required, but rather output 174 goes directly to coupling capacitor 188. In that case, the voltage equivalent of $n_{ri}$ never appears in TISK demodulator 160, except in digital form in buffer 171. These are only a few of the many types of circuits well-known in the art of the present invention which can be used in practicing the art as taught by the present invention. Other types of well-known circuits could also be used therein without departing from the spirit and scope of the present invention.

Figure 19:
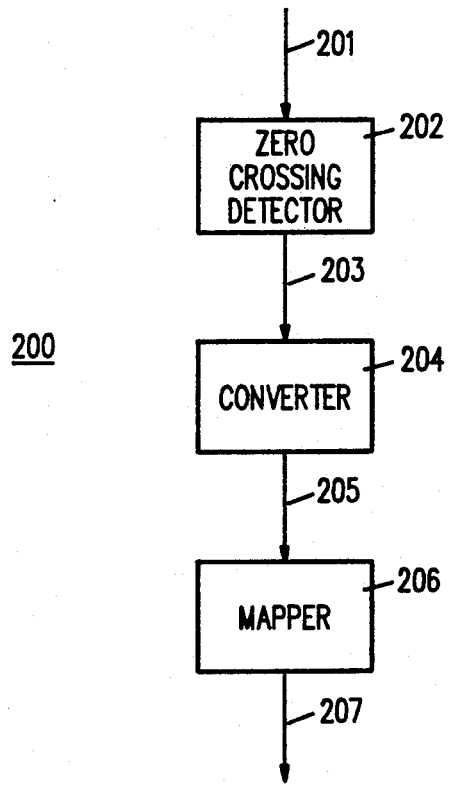
FIG. 19 is a block diagram of a demodulator circuit according to the present invention.

Referring to FIG. 19, demodulator circuit 200 according to the present invention is shown. Demodulator circuit 200 comprises detector means 202, conversion means 204, and mapping means 206. Frequency modulated carrier signal 201, as received, is fed to detector means 202 for determining time of occurrence of zero values of carrier signal 201. Detector means 202 can be any of various well-known circuits for detecting changes in polarity of a signal. Detector means 202 are coupled to conversion means 204. Conversion means 204 measures the interval between zero-crossings and provides a voltage based on time intervals between zero-crossings as detected by detector means 202. Conversion means 204 converts an interval between zero-crossings into a representative voltage such that frequency characteristics of the source signal are substantially equivalent to the voltage so converted. Conversion means 204 are coupled to mapping means 206 through output 205. Mapping means 206 provide a demodulated output 207 of the carrier signal 201. Mapping means can be any of the means as described herein, and any as are well-known in the prior art of the present invention.

The present invention has been particularly shown and described with respect to a best mode and features thereof. However, it should be readily apparent to those of ordinary skill in the art that various changes and modifications in form and detail may be made without departing from the spirit and scope of the invention as set forth in the appended claims. Moreover, the invention illustratively disclosed herein may be practiced in the absence of any element which is not specifically disclosed herein.

What is claimed is:

1. A method for recovering a message signal from a carrier signal, said method comprising the following steps in the sequence set forth:
   receiving said carrier signal;
   detecting zero-crossings of said carrier signal;
   determining time intervals between successive said zero-crossings; and
   mapping to recover said message signal from said carrier signal with said time intervals.

2. A method for recovering a message signal from a carrier signal, as recited in claim 1, further comprising the steps of:
   converting said time intervals into a representative voltage signal; and
   averaging said voltage signal to provide an output signal substantially similar to said message signal.

3. A method for recovering a message signal from a carrier signal, as recited in claim 2, wherein the step of mapping comprises the step of:
   altering said voltage signal such that said voltage signal is substantially equivalent to said message signal after averaging.

4. A method for recovering a message signal from a carrier signal, as recited in claim 2, wherein the step of mapping comprises the step of:
  altering said output signal such that said output signal is substantially equivalent to said message signal.

5. A method of demodulating a message signal from a frequency modulated signal, said method comprising the steps of:
  receiving said frequency modulated signal;
  detecting approximate locations of zero-crossings of said frequency modulated signal; measuring time intervals between successive approximate locations of said zero-crossings;
  converting said time intervals into a representative voltage signal;
  mapping said representative voltage signal to more accurately demodulate said message signal from said frequency modulated signal;
  averaging said representative voltage signal to more accurately demodulate said message signal from said frequency modulated signal; and
  providing an output signal from said mapping and averaging of said voltage signal, said output signal substantially equivalent to said message signal.

6. A method of demodulating, as recited in claim 5, wherein said step of converting comprises the steps of:
  determining inverse values for said time intervals; and
  converting said inverse values of said time intervals into said representative voltage signal.

7. A method of demodulating, as recited in claim 6, wherein said step of mapping includes processing said representative voltage on an half-cycle by half-cycle of said frequency modulated signal basis.

8. A method of demodulating, as recited in claim 7, wherein said step of averaging is accomplished with a lowpass filter.

9. An apparatus for demodulating a received frequency modulated carrier signal modulated by a message signal, said apparatus comprising:
  an amplifier for amplifying, said amplifier amplifying voltage within a predetermined frequency band of a received said carrier signal;
  a limiter coupled to said amplifier for limiting amplitudes of said carrier signal;
  a multivibrator coupled to said limiter for generating time interval pulses based on zero-crossings of said carrier signal;
  a clock for providing clock pulses;
  a counter coupled to said multivibrator and to said clock for counting clock pulses between successive time interval pulses from said multivibrator, said counter providing output counts based on said clock pulses and said time interval pulses;
  a storage device coupled to said counter for temporarily storing said output counts;
  conversion circuitry coupled to said storage device for providing an analog signal substantially similar to said message signal;
  a coupling capacitor coupled to said conversion circuitry for removing direct current components in said analog signal; and
  a filter coupled to said coupling capacitor for limiting said analog signal to a predetermined range of frequencies;
  wherein said apparatus demodulates said message signal from said carrier signal.

10. An apparatus for demodulating, as recited in claim 9, wherein said conversion circuitry includes a digital-to-analog converter coupled to said storage device for converting said output counts to a corresponding analog signal.

11. An apparatus for demodulating, as recited in claim 10, wherein said conversion circuitry includes mapping circuitry coupled to said digital-to-analog converter for providing a mapped version of said analog signal.

12. An apparatus for demodulating, as recited in claim 11, further comprising a dividing circuit coupled between said limiter and said multivibrator for reducing the values of the frequencies in said predetermined frequency band of said carrier signal as amplified.

13. A method for demodulating a frequency modulated carrier signal modulated by a message signal, said method comprising the steps of:
  receiving said carrier signal;
  amplifying voltage of said carrier signal within a predetermined frequency band of said carrier signal;
  limiting amplitudes of said carrier signal after amplification;
  after the step of amplifying voltage, dividing for frequency division to reduce values of frequencies in said predetermined frequency band of said carrier signal;
  generating time interval pulses with a multivibrator based on zero-crossings of said carrier signal;
  generating clock pulses;
  counting clock pulses between successive time interval pulses from said multivibrator; determining output counts based on said clock pulses and said time interval pulses;
  temporarily storing said output counts;
  providing an analog signal substantially similar to said message signal from said output counts;
  removing direct current components from said analog signal; and
  limiting said analog signal to a predetermined range of frequencies.

14. An apparatus for demodulating a received frequency modulated carrier signal modulated by a message signal, said apparatus comprising:
  an amplifier for amplifying, said amplifier amplifying voltage within a predetermined frequency band of a received said carrier signal;
  a limiter coupled to said amplifier for limiting amplitudes of said carrier signal;
  a multivibrator coupled to said limiter for generating time interval pulses based on zero-crossings of said carrier signal;
  a generator coupled to said multivibrator for providing voltages based on and for each time interval between successive said time interval pulses;
  a sample and hold circuit coupled to said multivibrator and to said generator for providing constant voltages for periods of time defined by each said time interval, said sample and hold circuit providing an analog signal therein;
  mapping circuitry coupled to said sample and hold circuit for reducing effects of interference on said analog signal, said mapping circuitry providing a mapped version of said analog signal;
  a coupling capacitor coupled to said mapping circuitry for removing direct current components in said analog signal; and a filter coupled to said coupling capacitor for limiting said mapped version of said analog signal to a predetermined range of frequencies;

wherein said apparatus demodulates said message signal from said carrier signal.

15. An apparatus for demodulating, as recited in claim 14, further comprising a dividing circuit coupled between said limiter and said multivibrator for reducing the values of the frequencies in said predetermined frequency band of said carrier signal as amplified.

16. A method for demodulating a received frequency modulated carrier signal modulated by a message signal, said method comprising the steps of:

amplifying voltage within a predetermined frequency band of a received said carrier signal;

after the step of amplifying, limiting amplitudes of said carrier signal;

after the step of limiting, generating time interval pulses based on zero-crossings of said carrier signal;

providing voltages based on and for each time interval between successive said time interval pulses;

generating constant voltages for periods of time defined by each said time interval and providing an analog signal therein;

mapping to reduce effects of interference on said analog signal and providing a mapped version of said analog signal therein;

removing direct current components in said mapped version of said analog signal; and limiting said mapped version of said analog signal to a predetermined range of frequencies.

17. A method for demodulating, as recited in claim 16, further comprising the step of:

after the step of amplifying, reducing the values of frequencies in said predetermined frequency band of said carrier signal.

18. A method of demodulating a time varying voltage superimposed on a carrier signal for frequency modulation of said carrier signal, said carrier signal being transmitted, received and interfered with interference therein, said method for demodulating said time varying voltage from said carrier signal capable of substantially linear degradation for small values of input signal-to-noise ratio when said interference is approximately as strong as said carrier signal, said method comprising the steps of:

determining approximate zero-crossings of a received said carrier signal;

further determining time differences between adjacent said zero-crossings; and converting said zero-crossings into a representative analog signal therein, said analog signal substantially equivalent to said time varying voltage, step of converting includes the step of mapping said analog signal.

19. A method of demodulating, as recited in claim 18, wherein said step of converting includes the step of averaging said analog signal.

20. A method of demodulating, as recited in claim 19, wherein said step of averaging is accomplished with an analog filter.

21. A method of demodulating, as recited in claim 19, wherein said step of averaging is accomplished with a digital filter.

22. A method of demodulating, as recited in claim 19, wherein said step of determining is accomplished by sampling of said carrier signal at a predetermined rate.

23. A method of demodulating, as recited in claim 19, wherein said step of determining is accomplished by enabling a multivibrator on each polarity change of said carrier signal.

24. A method of demodulating, as recited in claim 19, wherein said step of mapping includes determining a mean value from a predetermined number of said time differences.

25. A method of demodulating, as recited in claim 19, wherein said step of mapping includes clipping values of said time differences.

26. A method of demodulating, as recited in claim 19, wherein said step of mapping includes delta mapping of said time differences.

27. A method of demodulating, as recited in claim 26, wherein said step of mapping includes clipping values of said time differences.

28. A method of demodulating, as recited in claim 19, wherein said step of mapping includes two-valued mapping of said time differences.

29. A method of demodulating, as recited in claim 28, wherein said step of two-valued mapping includes determining a threshold value for said time differences.

30. A method of demodulating a time varying voltage from a frequency modulated carrier signal, said carrier signal being transmitted, received and interfered with interference, said method capable of demodulating said time varying voltage from said carrier signal for an input signal-to-noise ratio of near zero decibels, said method comprising the steps of:

determining approximate zero-crossings of a received said carrier signal;

further determining time differences between adjacent said zero-crossings; and converting said time differences into a representative analog signal, as said time differences approximate said time varying voltage, said analog signal is representative of said time varying voltage, said step of converting includes the step of mapping said analog signal.

31. A method of demodulating, as recited in claim 30, wherein said step of converting includes the step of averaging said analog signal.

32. An apparatus for demodulating a received frequency modulated carrier signal comprising:

detector means for detecting zero-crossings of said carrier signal;

conversion means coupled to said detector means for providing a voltage based on time intervals between said zero-crossings; and mapping means coupled to said conversion means for providing a demodulated output of said carrier signal.

33. Apparatus, as recited in claim 32, wherein said mapping means includes averaging means for averaging said time intervals between said zero-crossings to provide said demodulated output of said carrier signal.

* * * * *